United States Patent
Okumichi et al.

(10) Patent No.: US 8,552,618 B2
(45) Date of Patent: Oct. 8, 2013

(54) SURFACE ACOUSTIC WAVE DEVICE WITH IDT ELECTRODES HAVING DIFFERENT ELECTRODE FINGER PITCHES AND COMMUNICATION APPARATUS USING SAME

(75) Inventors: Takehiro Okumichi, Kyoto (JP); Hiroyuki Tanaka, Kyoto (JP)

(73) Assignee: Kyocera Corporation, Kyoto (JP)

( * ) Notice: Subject to any disclaimer, the term of this patent is extended or adjusted under 35 U.S.C. 154(b) by 455 days.

(21) Appl. No.: 12/989,395

(22) PCT Filed: Apr. 24, 2009

(86) PCT No.: PCT/JP2009/058213
§ 371 (c)(1),
(2), (4) Date: Oct. 22, 2010

(87) PCT Pub. No.: WO2009/131227
PCT Pub. Date: Oct. 29, 2009

(65) Prior Publication Data
US 2011/0043075 A1    Feb. 24, 2011

(30) Foreign Application Priority Data

Apr. 25, 2008  (JP) .................................. 2008-115371
Jun. 27, 2008  (JP) .................................. 2008-169259

(51) Int. Cl.
*H03H 9/00*    (2006.01)
(52) U.S. Cl.
CPC ................................... *H03H 9/0009* (2013.01)
USPC .................... 310/313 B; 310/313 R

(58) Field of Classification Search
USPC ........................................................ 310/313
See application file for complete search history.

(56) References Cited

U.S. PATENT DOCUMENTS

| | | | |
|---|---|---|---|
| 6,853,269 B2 * | 2/2005 | Nakamura et al. ............. | 333/193 |
| 6,853,270 B2 * | 2/2005 | Shibahara ....................... | 333/195 |
| 6,975,180 B2 | 12/2005 | Nakamura et al. | |
| 6,989,724 B2 * | 1/2006 | Watanabe et al. .............. | 333/133 |
| 7,042,313 B2 * | 5/2006 | Yata ............................... | 333/193 |
| 7,116,189 B2 * | 10/2006 | Takamine ....................... | 333/195 |
| 7,479,854 B2 * | 1/2009 | Takamine ....................... | 333/195 |
| 7,504,911 B2 * | 3/2009 | Otsuka et al. .................. | 333/195 |
| 8,358,177 B2 * | 1/2013 | Yamanaka ...................... | 331/154 |
| 2002/0017969 A1 | 2/2002 | Takamine ....................... | 333/193 |

(Continued)

FOREIGN PATENT DOCUMENTS

JP    2002-009587    1/2002
JP    2002-009588    1/2002

(Continued)

*Primary Examiner* — J. San Martin
(74) *Attorney, Agent, or Firm* — DLA Piper LLP (US)

(57) ABSTRACT

Among the plurality of IDT electrodes having serially divided type structures, when designating any three continuously and sequentially arranged IDT electrodes as first, second, and third IDT electrodes in the order of arrangement, electrode fingers are arranged so that a first electrode finger pitch P1 at the boundary between the first IDT electrode and the second IDT electrode in the first region and a second electrode finger pitch P2 at the boundary between the second IDT electrode and the third IDT electrode in the first region are equal, the first and second electrode finger pitches P1 and P2 are the smallest among electrode finger pitches of IDT electrodes in the first region, and each of the IDT electrodes has a third electrode finger pitch P3 larger than the first and second electrode finger pitches P1 and P2 in the first region.

12 Claims, 21 Drawing Sheets

(56) References Cited

U.S. PATENT DOCUMENTS

| | | | | |
|---|---|---|---|---|
| 2002/0047759 | A1* | 4/2002 | Takamine | 333/193 |
| 2002/0153970 | A1 | 10/2002 | Nato | 333/195 |
| 2006/0044079 | A1 | 3/2006 | Nishizawa et al. | 333/193 |
| 2006/0244550 | A1* | 11/2006 | Inoue et al. | 333/133 |
| 2008/0246552 | A1 | 10/2008 | Shibahara et al. | 333/25 |
| 2010/0259341 | A1* | 10/2010 | Nakai | 333/193 |
| 2012/0146746 | A1* | 6/2012 | Shimozono | 333/193 |

FOREIGN PATENT DOCUMENTS

| | | |
|---|---|---|
| JP | 2002-204139 | 7/2002 |
| JP | 2002-314366 | 10/2002 |
| JP | 2004-194269 | 7/2004 |
| JP | 2006-074202 | 3/2006 |
| JP | 2006-311180 | 11/2006 |
| JP | 2008085720 A | 4/2008 |
| WO | WO 2006/067884 A1 | 6/2006 |

* cited by examiner

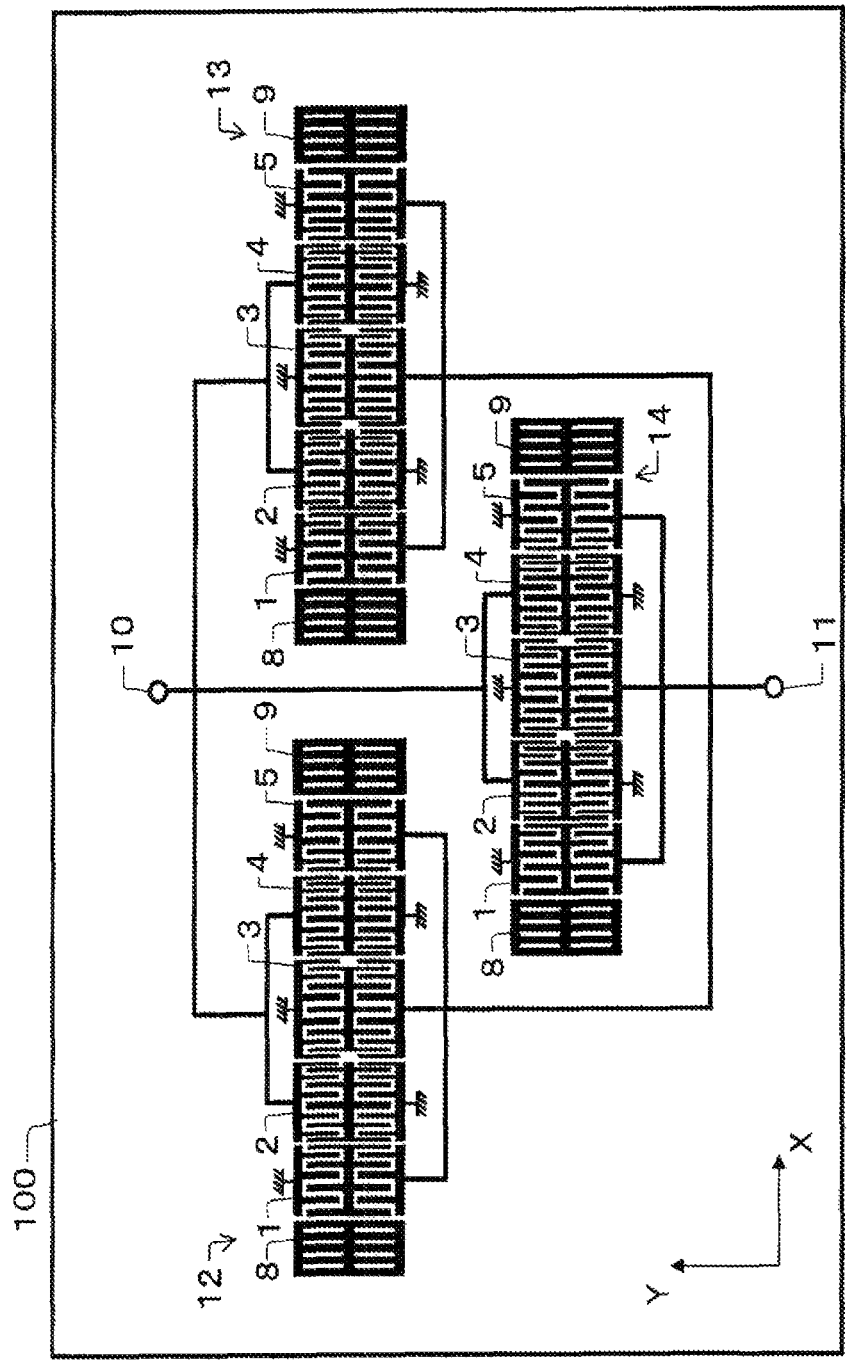

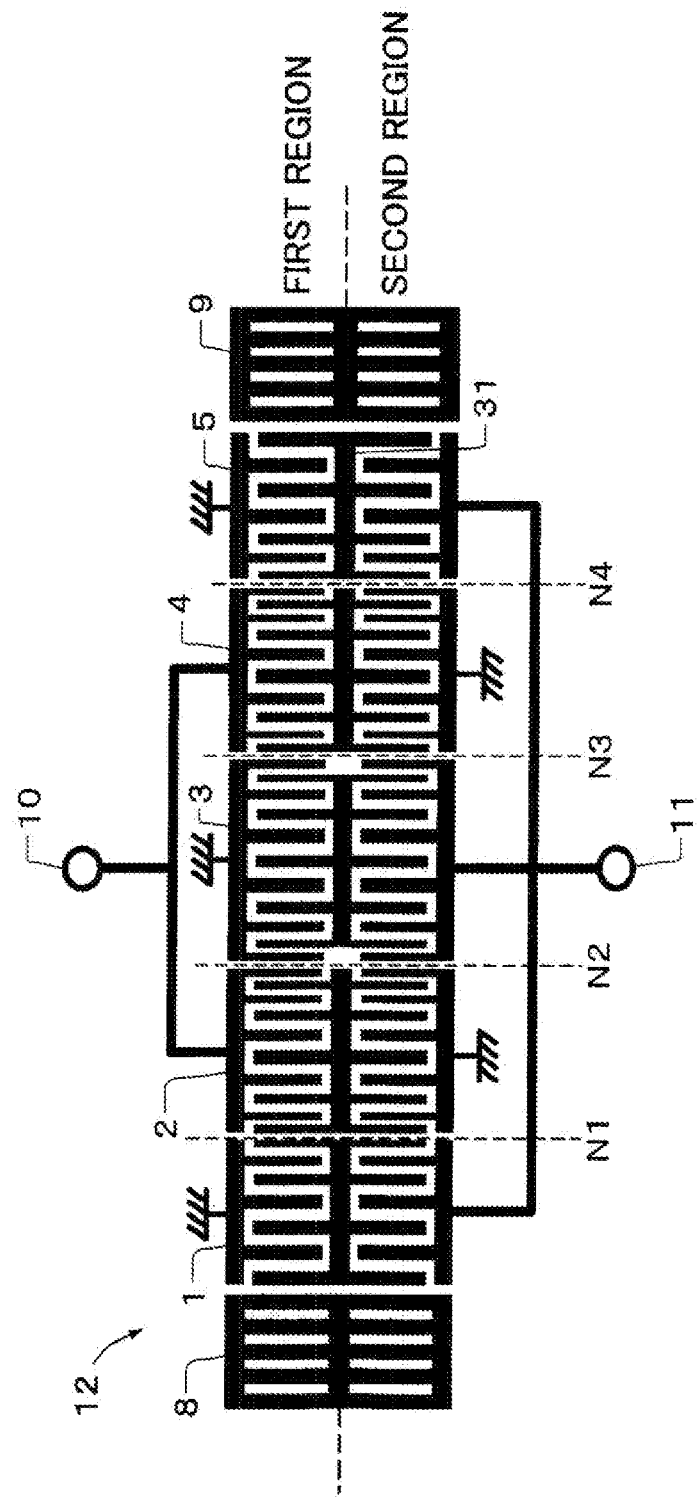

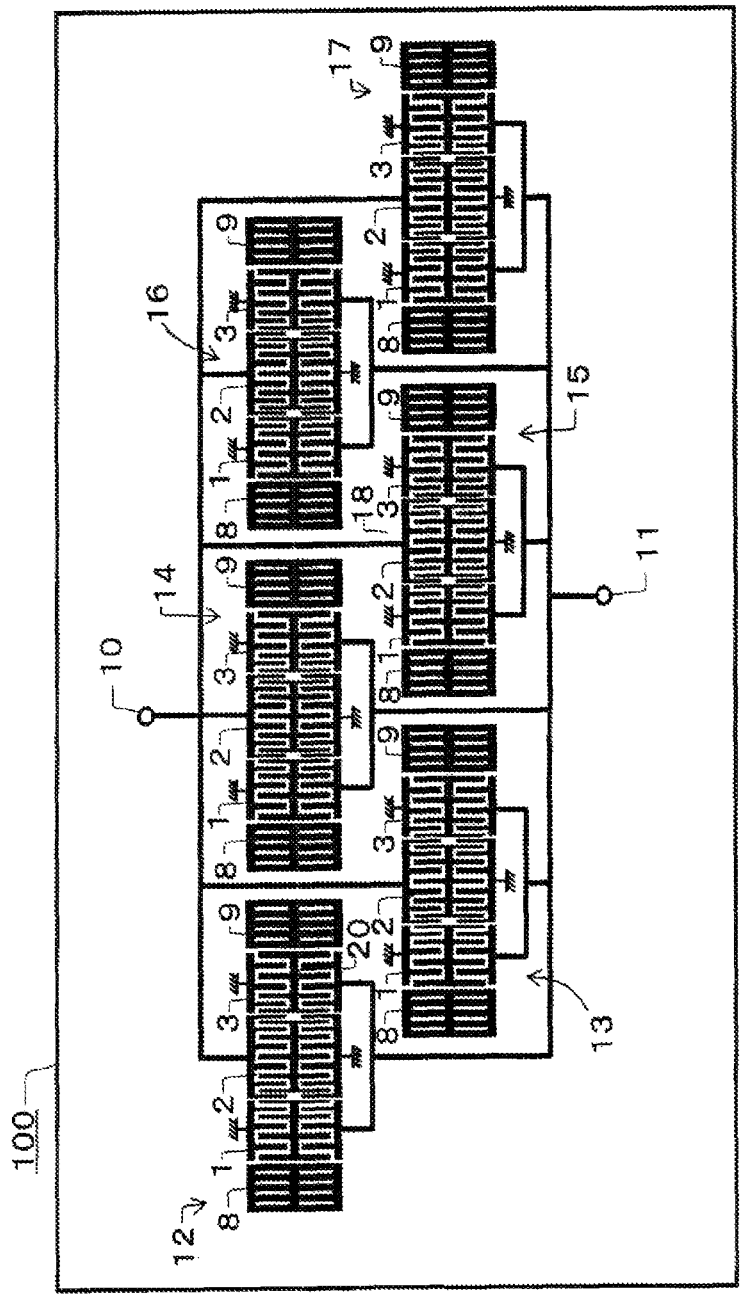

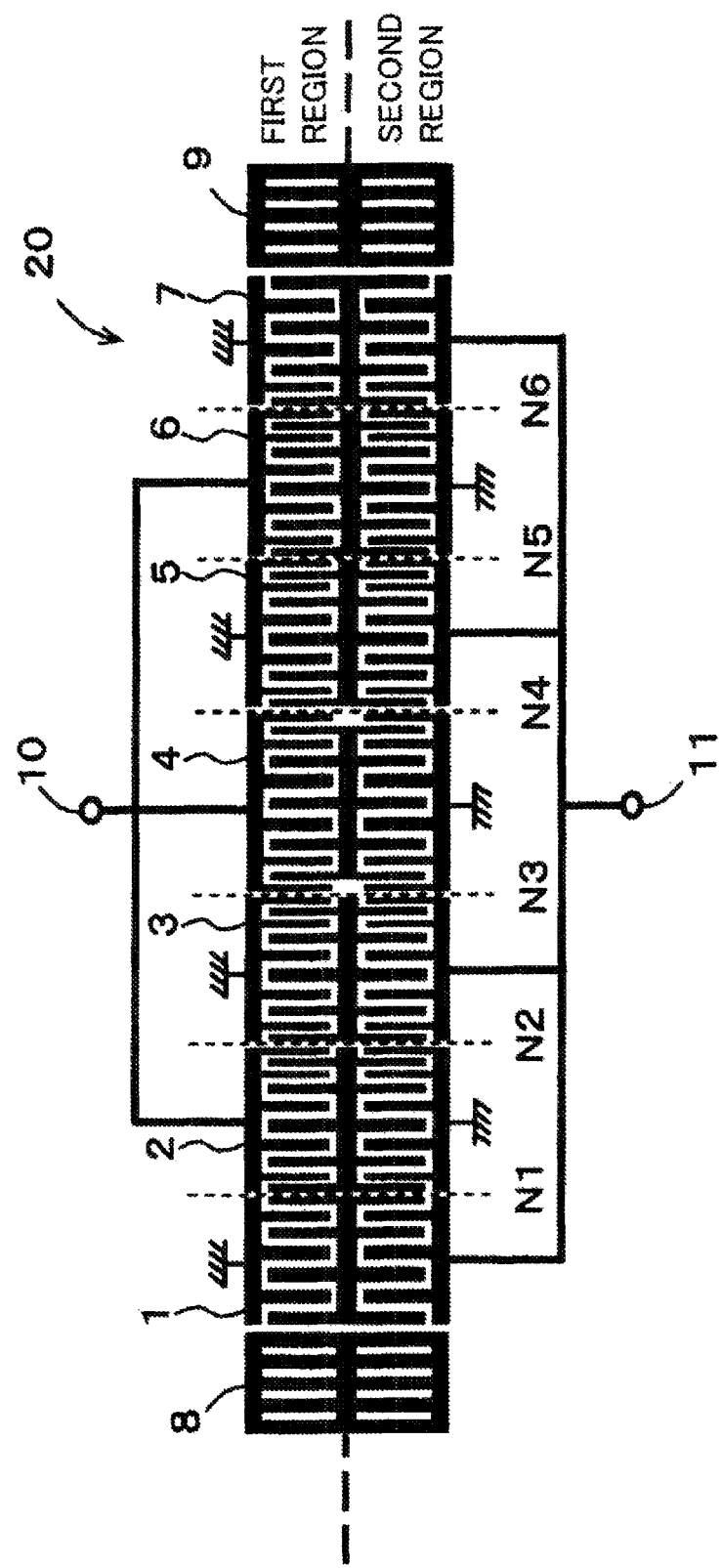

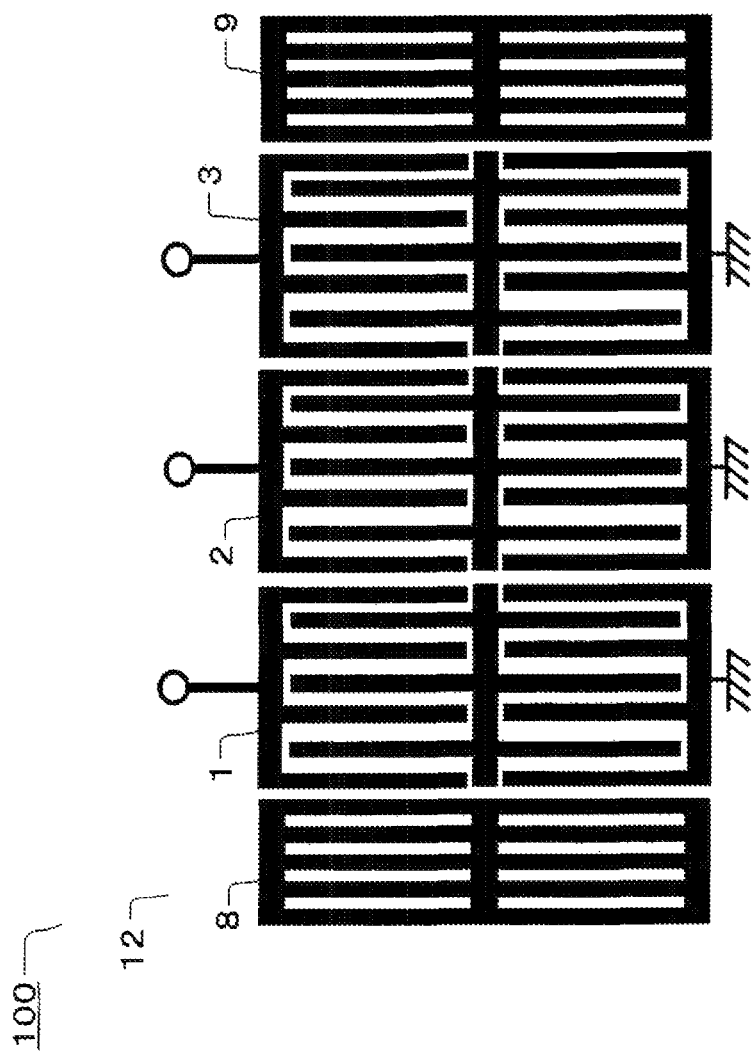

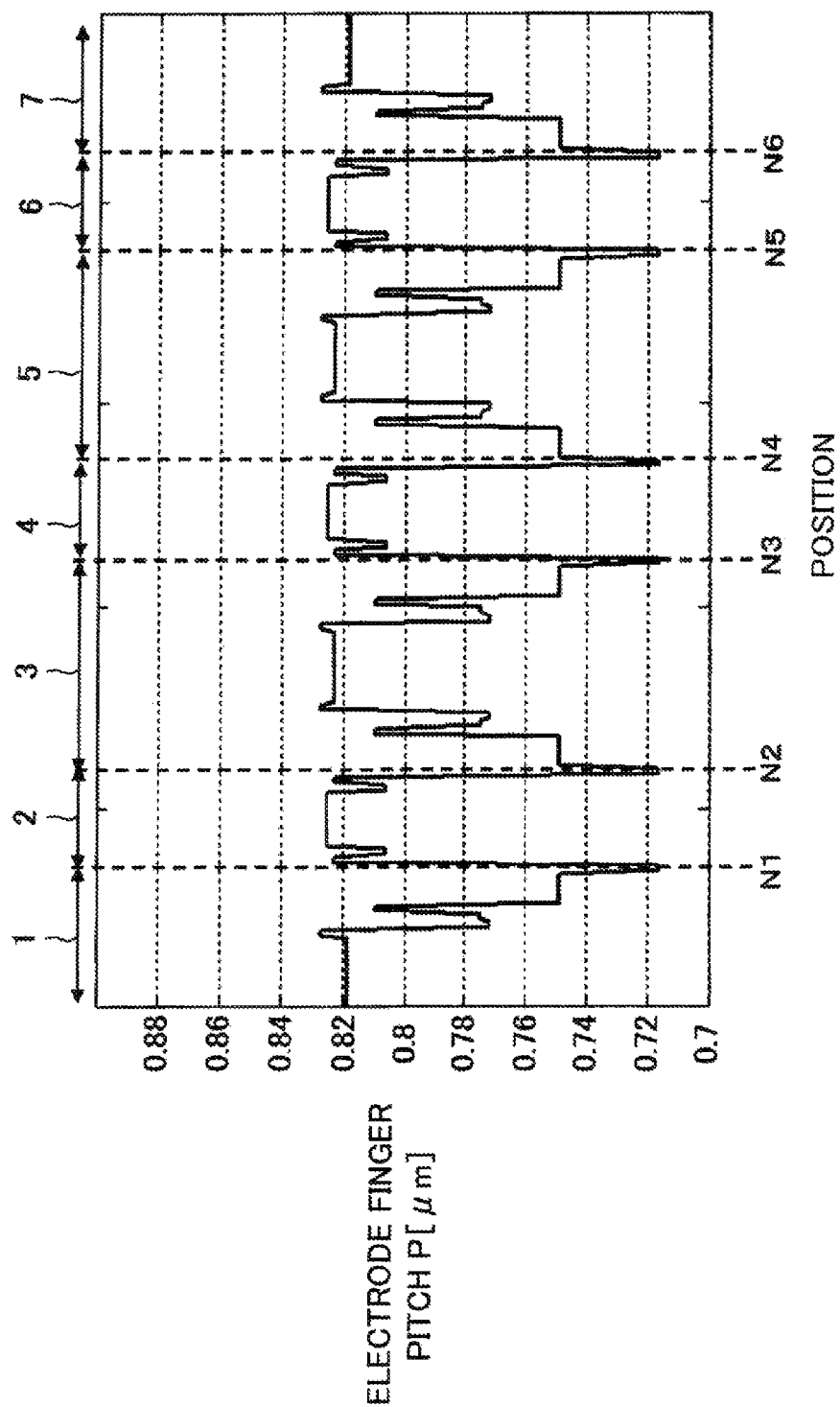

SURFACE ACOUSTIC WAVE DEVICE WITH IDT ELECTRODES HAVING DIFFERENT ELECTRODE FINGER PITCHES AND COMMUNICATION APPARATUS USING SAME

CROSS-REFERENCE TO THE RELATED APPLICATIONS

This application is a national stage of international application No. PCT/JP2009/058213, filed on Apr. 24, 2009, and claims the benefit of priority under 35 USC 119 to Japanese Patent Application No. 2008-115371, filed on Apr. 25, 2008 and Japanese Patent Application No. 2008-169259, filed on Jun. 27, 2008, the entire contents of all of which are incorporated herein by reference.

TECHNICAL FIELD

The present invention relates to a surface acoustic wave device used in a mobile communication apparatus etc. and to a communication apparatus using the same. Note that, hereinafter, a surface acoustic wave will be sometimes abbreviated as "SAW".

BACKGROUND ART

In recent years, communication apparatuses used for mobile communication are being used in higher frequency bands in order to handle services transmitting and receiving data utilizing wireless communication such as WLAN (wireless local area network) or the like. Along with the higher frequencies of these communication apparatuses, the electronic parts used for the same are also being required to be able to operate at higher frequencies.

As key parts of such communication apparatuses, there are surface acoustic wave devices (SAW device). A SAW device is used as, for example, an element for configuring a ladder-type surface acoustic wave filter (SAW filter). Such a filter is excellent in power durability performance and is being used in an antenna splitter etc. in a frequency band in which it operates at a high frequency. However, with a conventional ladder type SAW filter, it was difficult to sufficiently secure electric characteristics demanded by a communication apparatus operating at a high frequency, such as an attenuation characteristic in the vicinity of the pass band, an insertion loss characteristic of the pass band, an attenuation amount out of the pass band or the like.

For this reason, a SAW device using a multimode type SAW filter, capable of operating at a high frequency, and improved in electric characteristics such as the attenuation characteristic in the vicinity of the pass band, attenuation amount out of the pass band, or the like has been proposed. However, sufficient power durability performance is liable not to be able to be secured when a conventional multimode type SAW filter is operated at a high frequency.

FIG. 9 and FIG. 10 are plan views of principal parts showing conventional SAW devices. Here, as shown in FIG. 9, in order to sufficiently secure power durability performance, there is proposed a SAW device in which IDT (inter digital transducer) electrodes configuring a multimode type SAW filter, formed on a piezoelectric substrate, and exciting a SAW are serially divided to divide power supplied to the IDT electrodes (see for example Patent Document 1).

Further, as shown in FIG. 10, as another means for securing power durability performance, there is proposed a SAW device in which a plurality of surface acoustic wave elements (SAW elements) configuring a multimode type SAW filter are connected in parallel to disperse power supplied to the SAW elements (see for example Patent Document 2).

In the multimode type SAW filters shown in FIG. 9 and FIG. 10, by arranging narrow pitch sections at which an electrode finger pitch of the IDT electrodes becomes narrow at portions at which IDT electrodes adjoin each other, a reduction of loss and a broadening of the band of the SAW device are realized. In this case, if energy is concentrated at the electrode finger narrow pitch sections, stress is concentrated at the electrode finger narrow pitch sections.

Accordingly, it has been desired to provide a surface acoustic wave device and a communication apparatus excellent in power durability performance and capable of operating at a high frequency.

Patent Document 1: Japanese Patent Publication No. 2006-311180
Patent Document 2: Japanese Patent Publication No. 2004-194269

SUMMARY OF INVENTION

Technical Problem

A SAW device according to an embodiment of the present invention is a surface acoustic wave device having a piezoelectric substrate and a plurality of surface acoustic wave elements on the piezoelectric substrate. Each surface acoustic wave element has N (N≥whole number of 3 or more) number of IDT electrodes having a serially divided structure and arranged along a propagation direction of a surface acoustic wave. Each of the IDT electrodes has a floating electrode with a center bus bar, a plurality of first floating electrode fingers having first ends connected to one long side of the center bus bar and arranged at intervals from each other, and a plurality of second floating electrode fingers having first ends connected to the other long side of the center bus bar and arranged at intervals from each other; a first electrode with a plurality of electrode fingers between the plurality of first floating electrode fingers; and a second electrode with a plurality of electrode fingers between the plurality of second floating electrode fingers.

Among the plurality of IDT electrodes, when designating any three continuously and sequentially arranged IDT electrodes as first, second, and third IDT electrodes in the order of arrangement, dividing each surface acoustic wave element into a first region and a second region using a center line of the center bus bar as the boundary, making the first region the region in which the first floating electrode fingers and first electrode are arranged, and making the second region the region in which the second floating electrode fingers and second electrode are arranged, a first electrode finger pitch P1 at the boundary between the first IDT electrode and the second IDT electrode in the first region and a second electrode finger pitch P2 at the boundary between the second IDT electrode and the third IDT electrode in the first region are equal, the first and second electrode finger pitches P1 and P2 are the smallest among all electrode finger pitches of the N number of IDT electrodes in the first region, and each of the IDT electrodes has a third electrode finger pitch P3 larger than the first and second electrode finger pitches P1 and P2 in the first region.

Further, a communication apparatus according to an embodiment of the present invention has the above SAW device and at least one of a receiving circuit and a transmitting circuit.

According to the above SAW device, a SAW device having sufficient power durability performance even at a high frequency can be realized.

Further, according to the above communication apparatus, by providing the SAW device and at least one of a receiving circuit and a transmitting circuit, a highly reliable communication apparatus can be provided.

BRIEF DESCRIPTION OF DRAWINGS

FIG. 1 A plan view showing an embodiment of a SAW device of the present invention.

FIG. 2A A plan view of a SAW element in the SAW device shown in FIG. 1.

FIG. 3 A plan view showing a first modification example of the SAW device shown in FIG. 1.

FIG. 8A A plan view schematically showing a SAW element configuring a SAW filter of a working example.

FIG. 9 A plan view showing a conventional SAW device.

FIG. 12B A graph showing electrode finger pitches of IDT electrodes of Comparative Example 2

EMBODIMENTS OF INVENTION

Below, examples of embodiments of a SAW device of the present invention be explained in detail based on the drawings. Note that, the drawings used in the following embodiments are schematic ones. Accordingly, the dimensions, ratios, etc. on the drawings do not necessarily coincide with the real ones.

FIG. 1 is a plan view showing a SAW device according to an embodiment of the present invention. Note that, in the following drawings, the same portions are assigned the same notations.

As shown in FIG. 1, the SAW device of the present embodiment is mainly configured of a piezoelectric substrate 100 and three SAW elements 12, 13, and 14 formed on the piezoelectric substrate 100.

The piezoelectric substrate 100 is made of for example an $LiNbO_3$ substrate, $LiTaO_3$ substrate, or the like. Note that, on the main surface of the piezoelectric substrate 100, along an outer circumferential edge, annular electrodes for tightly sealing the SAW elements 12, 13, and 14, signal electrodes for extracting signals of the SAW elements 12, 13, and 14 to the outside, and so on are provided at predetermined positions (not shown).

Each of the SAW elements 12, 13, and 14 provided on the main surface of the piezoelectric substrate 100 has the same configuration and is provided with five IDT electrodes 1, 2, 3, 4, and 5 having the serially divided structure and reflector electrodes 8 and 9 arranged at the two sides of these five IDT electrodes.

Figure 11:
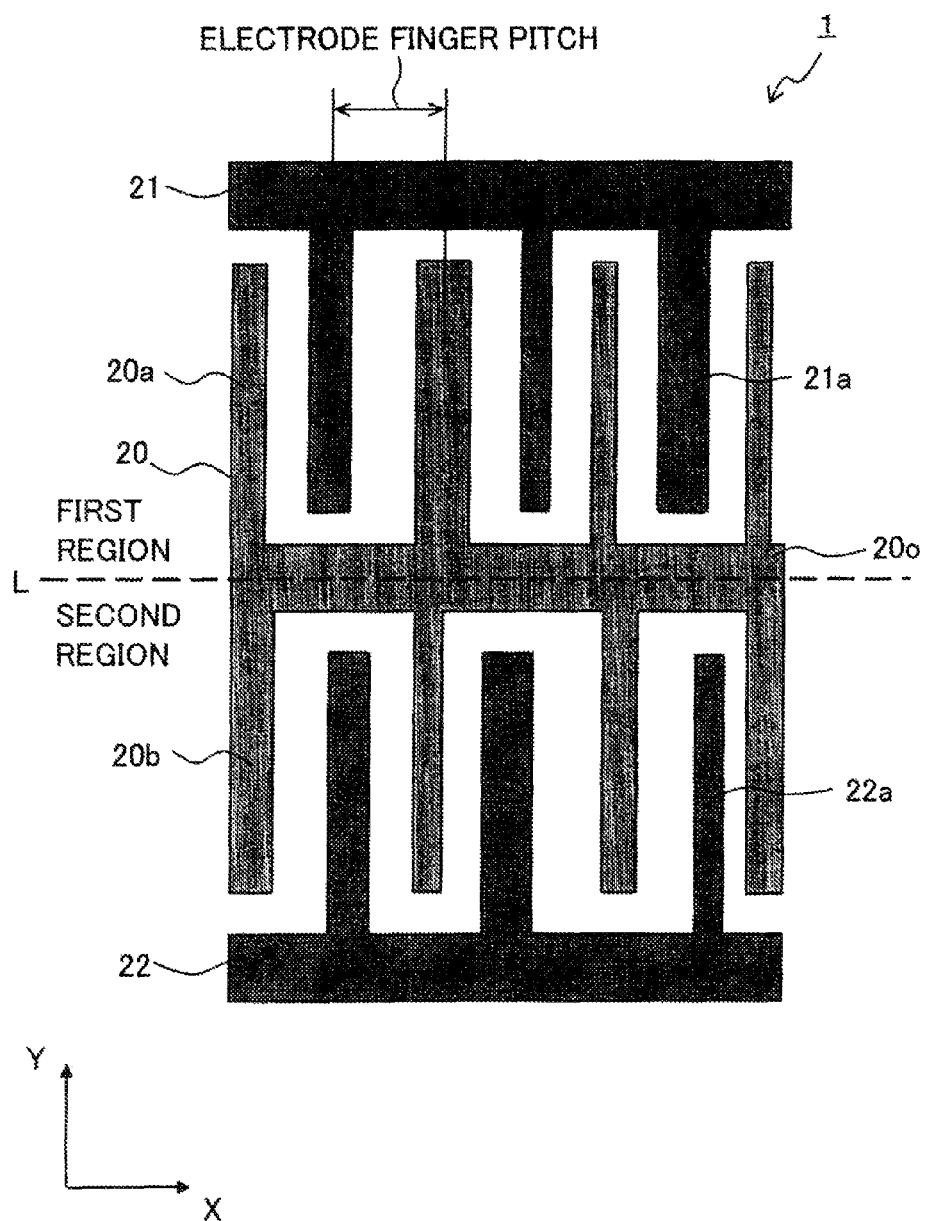
FIG. 11 A plan view showing a portion of an IDT electrode shown in FIG. 1.

FIG. 11 is a plan view of a portion of the IDT electrode 1 having a serially divided structure. As shown in the figure, the serially divided IDT electrode 1 has a configuration provided with a floating electrode 20, a first electrode 21, and a second electrode 22. The floating electrode 20 is provided with a center bus bar 20 o, a plurality of electrode fingers (first floating electrode fingers) 20a baying first ends connected to one long side of the center bus bar 20o and arranged at intervals from each other, and a plurality of electrode fingers (second floating electrode fingers) 20b having first ends connected to the other long side of the center bus bar 20o and arranged at intervals from each other. Further, the first electrode 21 is provided with a plurality of electrode fingers 21a arranged so that each is located between two of a plurality of electrode fingers 20a extended from the center bus bar 20o, and the second electrode 22 is provided with a plurality of electrode fingers 22a arranged so that each is located between two of a plurality of electrode fingers 20b extended from the center bus bar 20o. These electrode fingers are arranged along the propagation direction (X direction in the figure) of the SAW propagating on the piezoelectric substrate 100 and are formed to extend in a direction perpendicular to the propagation direction.

L indicated by a dotted line in FIG. 11 is the center line of the center bus bar 20o. Using this center line L as the boundary, the SAW element is divided into a first region and a second region. In the present embodiment, using the center line L as the boundary, the side of extension of the electrode fingers 20a of the floating electrode 20 is the first region, and the side of extension of the electrode fingers 20b of the floating electrode 20 is the second region. Accordingly, the first electrode 21 and electrode fingers 20a are arranged in the first region, and the second electrode 22 and electrode fingers 20b are arranged in the second region.

The first electrode 21 and the second electrode 22 are given, for example, either of a potential of an input signal, a potential of an output signal, or a ground potential. Further, the floating electrode 20 is in a floating state where no potential is given at all. Namely, the serially divided IDT electrode 1 has a serially divided structure in which an IDT comprised of electrode fingers 20a and electrode fingers 21a, and an IDT comprised of electrode fingers 20b and electrode fingers 22a are serially connected. Further, the serially divided IDT electrodes 2 to 5 have the same structure as that of the serially divided IDT electrode 1.

The SAW elements 12 to 14 provided with such serially divided IDT electrodes 1 to 5 are connected in parallel to each other. In this way, a plurality of SAW elements 12 to 14 are connected in parallel, and each of the SAW elements 12 to 14 has configuration provided with serially divided IDT electrodes 1 to 5, therefore the power applied to the SAW device is dispersed among the SAW elements and IDT electrodes, thus concentration of energy to a specific IDT electrode is reduced, and the power durability of the SAW device can be improved. Further, by connecting a plurality of SAW elements 12 to 14 in parallel, intersecting widths of the serially divided IDT electrodes 1 to 5 can be made smaller, so the SAW device can be made small in size.

Further, the plurality of SAW elements 12 to 14 are connected to unbalanced signal terminals 10 and 11.

Figure 2B:
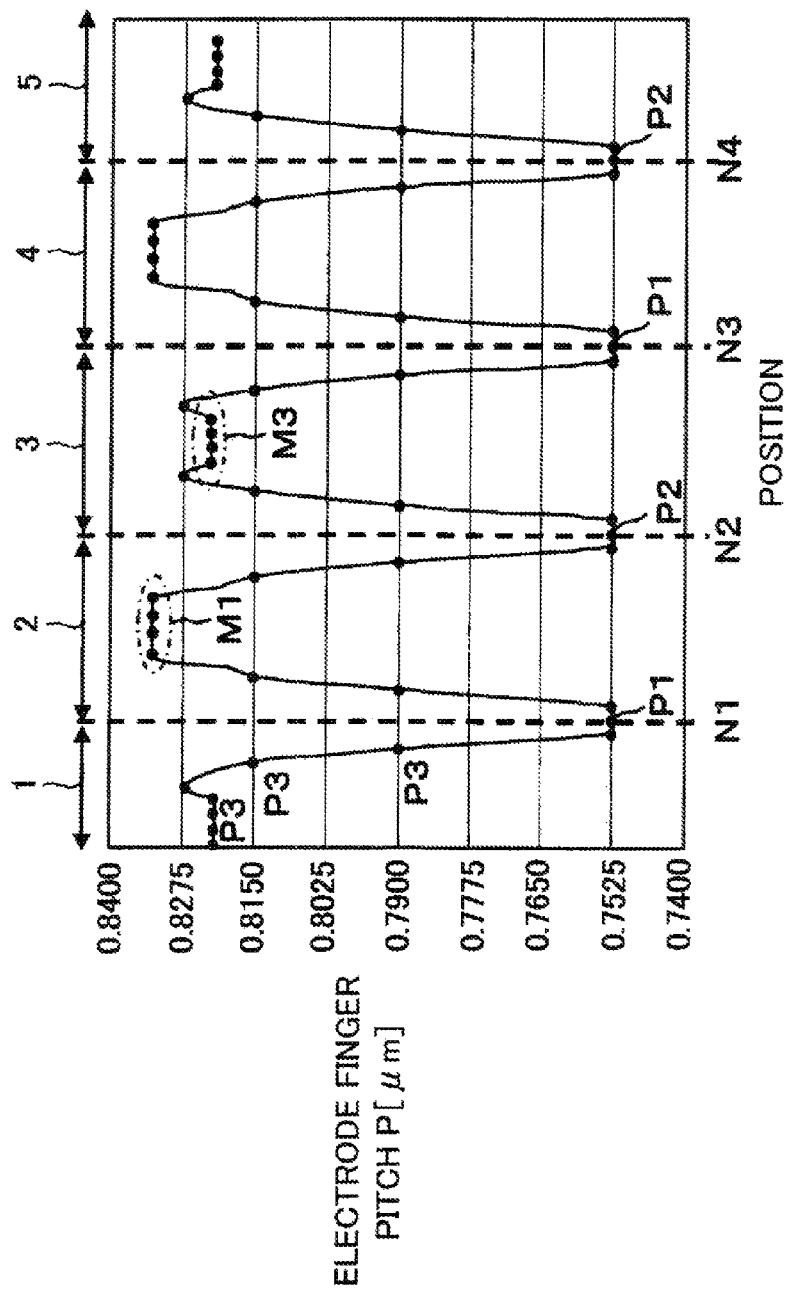
FIG. 2B A graph showing electrode finger pitches of serially divided IDT electrodes in a first region of the SAW element shown in FIG. 2A.
Figure 2C:
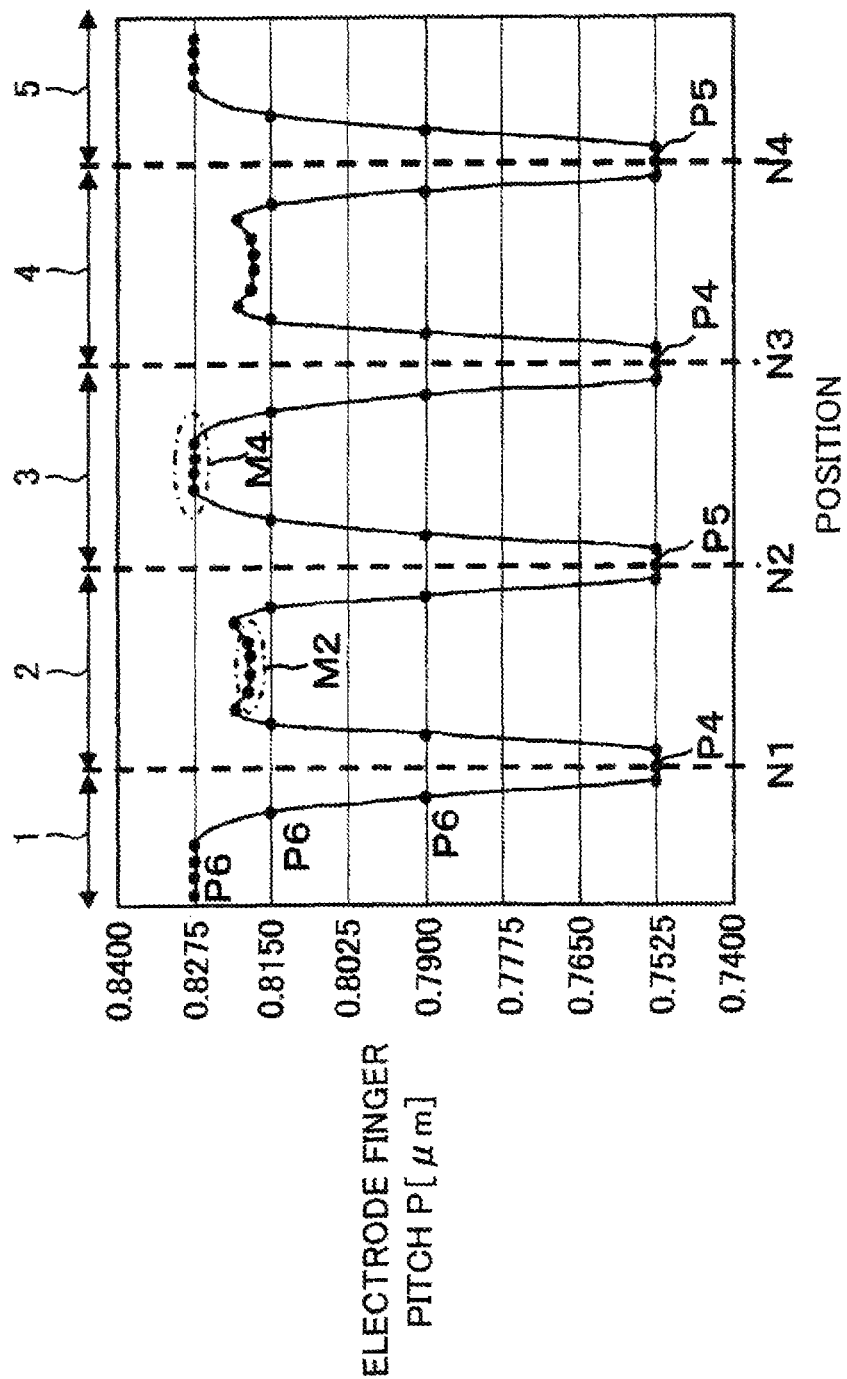
FIG. 2C A graph showing electrode finger pitches of serially divided IDT electrodes in a second region of the SAW element shown in FIG. 2A.

FIG. 2A to FIG. 2C are diagrams for explaining electrode finger pitches of the IDT electrodes configuring a SAW element according to the present embodiment. FIG. 2A is a plan view of the SAW element 12 shown in FIG. 1, FIG. 2B is a diagram plotting pitches of electrode fingers arranged in the first region of the IDT electrodes 1 to 5 configuring the SAW element 12, and FIG. 2C is a diagram plotting pitches of electrode fingers arranged in the second region of the IDT electrodes 1 to 5 configuring the SAW element 12. In FIG. 2A, N1 indicated by a dotted line is the boundary of the IDT electrode 1 and IDT electrode 2, N2 is the boundary of the IDT electrode 2 and IDT electrode 3, N3 is the boundary of the IDT electrode 3 and IDT electrode 4, and N4 is the boundary of the IDT electrode 4 and IDT electrode 5.

As shown in FIG. 2B, in the SAW element 12, in the first region, the electrode fingers are arranged so that the electrode finger pitches at the boundaries between adjacent IDT electrodes are the smallest and the electrode finger pitches become equal. In other words, among the IDT electrodes 1 to 5, where designating any three continuously and sequentially arranged IDT electrodes as first, second, and third electrodes in the order of arrangement, the electrode fingers are arranged so that a first electrode finger pitch P1 at the boundary between the first IDT electrode and the second IDT electrode in the first region and a second electrode finger pitch P2 at the boundary between the second IDT electrode and the third IDT electrode in the second region are equal and further the first and second electrode finger pitches P1 and P2 become the smallest among the pitches of all electrode fingers arranged in the first region of the IDT electrodes 1 to 5. In FIG. 2A, the IDT electrode 1, IDT electrode 2, and IDT electrode 3 are sequentially defined as a first IDT electrode, second IDT electrode, and third IDT electrode. In the same way, the IDT electrode 3, IDT electrode 4, and IDT electrode 5 are sequentially defined as a first IDT electrode, second IDT electrode, and third IDT electrode. Accordingly, the electrode finger pitch at the boundary between the IDT electrode 1 and IDT electrode 2 in the first region and the electrode finger pitch at the boundary between the IDT electrode 3 and IDT electrode 4 in the first region correspond to the first electrode finger pitch P1, and the electrode finger pitch at the boundary between the IDT electrode 2 and IDT electrode 3 in the first region and the electrode finger pitch at the boundary between the IDT electrode 4 and IDT electrode 5 in the first region correspond to the second electrode finger pitch P2.

Further, in the SAW element according to the present embodiment, as shown in FIG. 2B, the electrode fingers are arranged so that there are electrode finger pitches equal to the first and second electrode finger pitches P1 and P2 on both sides of the first electrode finger pitch P1 and both sides of the second electrode finger pitch P2. Further, in the first region of each IDT electrode, the electrode fingers are arranged so that there is a third electrode finger pitch P3 larger than the first and second electrode finger pitches P1 and P2. By providing such an electrode finger arrangement structure, the power is equally dispersed and applied in the narrow pitch sections of the electrode fingers, so concentration of energy to a specific electrode finger narrow pitch section can be suppressed. Thus a SAW device having sufficient power durability even at a high frequency can be formed. Specifically, the SAW device according to the present embodiment can satisfy the strict power durability characteristic required from 2300 MHz to 2700 MHz that is pass frequency band of the WLAN etc.

Note that, from the viewpoint of electrical characteristics, preferably the third electrode finger pitch P3 is made gradually smaller toward the boundary between adjacent IDT electrodes. Further, FIG. 2B is a conceptual view, therefore relatively few third electrode finger pitches P3 are plotted. In actuality, when the pitches are set so that the characteristics required for the communication use filter etc. are obtained, there are a relatively large number of third electrode finger pitches P3 compared with the number of the first and second electrode finger pitches P1 and P2 (for example, several or more times the numbers of the first and second electrode finger pitches P1 and P2). Accordingly, in the portion where the third electrode finger pitches P3 exist, concentration of energy is hard to occur.

Further, in the present embodiment, the electrode fingers are arranged so that the electrode finger pitch in the first region and the electrode finger pitch in the second region at the boundary N1 become equal. That is, as will be understood when viewing FIG. 2B and FIG. 2C, the electrode finger pitch P1 in the first region at the boundary N1 and the electrode finger pitch P4 in the second region at the boundary N1 are equal. For the boundaries N2, N3, and N4 as well, in the same way as the boundary N1, the electrode fingers are arranged so that the electrode finger pitch in the first region and the electrode finger pitch in the second region become equal. In other words, the electrode fingers are arranged so that a fourth electrode finger pitch P4 in the second region between the first IDT electrode 1 and the second IDT electrode 2 and the first electrode finger pitch P1 are equal and so that a fifth electrode finger pitch P5 at the boundary of the second region between the second IDT electrode 2 and the third IDT electrode 3 and the second electrode finger pitch P2 become equal. By arranging the electrode fingers in this way so that the pitches become equal for the electrode finger pitch in the first region and the electrode finger pitch in the second region located at the same boundary, the power applied to the SAW device is uniformly applied over the entire SAW device, so concentration of energy to a specific IDT electrode can be more effectively suppressed. Thus the power durability of the SAW device can be greatly improved.

In a SAW device using serially divided IDT electrodes, as will be explained later, the electrode finger pitch in the first region and the electrode finger pitch in the second region are different. This is because the frequency characteristic of the SAW propagated in the first region is controlled by adjusting the electrode fingers in the first region, and the frequency characteristic of the SAW propagated in the second region is controlled by adjusting the electrode fingers in the second region. Namely, the SAW propagated in the first region and the SAW propagated in the second region are individually adjusted in frequency characteristics. Accordingly, from the viewpoint of adjustment of the frequency characteristics, for the electrode finger pitch in the first region and electrode finger pitch in the second region at the same boundary as well, the electrode fingers are arranged so that the two are different. However, the inventors of the present application engaged in intensive and repeated studies on the relationship between the power durability performance and the electrode finger pitches and as a result discovered that, in a SAW element using IDT electrodes having a serially divided structure, the electrode finger pitch in the narrow pitch sections at the boundaries have a large influence upon the power durability. Namely, they found that, among the electrode finger pitches in the first region and electrode finger pitches in the second region set so as to be different, when making the electrode finger pitch in the first region and the electrode finger pitch in the second region at the same boundary equal, the power durability of the SAW device became much better.

Note that, in the second region as well, in the same way as the electrode finger pitch of the first region, the electrode fingers are arranged so that there are electrode finger pitches equal to the fourth and fifth electrode finger pitches P4 and P5 at both sides of the fourth electrode finger pitch P4 and both sides of the fifth electrode finger pitch P5. Further, in each of the serially divided IDT electrodes, the electrode fingers are arranged so that there is a sixth electrode finger pitch P6 larger than the fourth and fifth electrode finger pitches P4 and P5.

In each IDT electrode, the electrode fingers are arranged so that the method of change of electrode finger pitch from one end to the other end differs between the first region and the second region. For example, in FIG. 2B and FIG. 2C, when paying attention to the method of change of the electrode finger pitch from the boundary N1 to the boundary N2 in the IDT electrode 2, it is seen that the method of change differs between the first region and the second region. For the other IDT electrodes as well, in the same way, the method of change of the electrode finger pitch differs between the first region and the second region. By separately changing the electrode finger pitch between the first region and the second region in this way, the frequency characteristic can be adjusted for each of the SAW propagated in the first region and the SAW propagated in the second region, so a SAW device excellent in frequency characteristic can be provided. In particular, any major pitch section of the IDT electrode is preferably set so as to satisfy the predetermined relationships. Here, a "major pitch section" means a portion in which the number of the same pitches is the largest among electrode finger pitches of the IDT electrode. For example, when paying attention to the IDT electrode 2 in FIG. 2B, the number of same pitches is largest in a portion surrounded by a one-dot chain line. This portion becomes the major pitch section in the first region of the IDT electrode 2. In the present embodiment, this major pitch section is set so as to satisfy the predetermined relationships between adjacent IDT electrodes. Specifically, the electrode fingers are arranged so that the IDT electrode 2 has a first major pitch section M1 in the first region (FIG. 2B), and has a second major pitch section M2 having a smaller pitch than the pitch of the first major pitch section M1 in the second region (FIG. 2C). Further, the electrode fingers are arranged so that the IDT electrode 3 adjacent to the IDT electrode 2 has a third major pitch section M3 in the first region (FIG. 2B) and has a fourth major pitch section M4 having a larger pitch than the pitch of the third major pitch section M3 in the second region (FIG. 2C). Namely, between adjacent IDT electrodes, largeness and smallness of major pitch sections provided in the first region and the second region are alternate. By arranging the electrode fingers so that the major pitch sections satisfy such relationships, the attenuation in the vicinity of the pass band can be made rapid while keeping the VSWR (Voltage Standing Wave Ratio) at both end sections of the pass band of the SAW filter low.

Here, the "electrode finger pitch" in the present invention means a distance between centers of adjacent electrode fingers (see FIG. 11). Further, the first electrode finger pitch P1 and the second electrode finger pitch P2 being equal means existence within a range of $|P1-P2| \leq 0.01$ μm. For the fourth electrode finger pitch P4 and fifth electrode finger pitch P5 as well, in the same way, the two are equal when these are within the range of $|P4-P5| \leq 0.01$ μm.

Next, an example of a method of production of the SAW device shown in FIG. 1 is explained. First, a mother board made of a piezoelectric material is prepared for obtaining several devices. Such a mother board is made of, for example, a single crystal of 38.7° Y-cut X-direction propagation LiTaO$_3$. Next, in each SAW element region of the mother board, various types of electrodes such as IDT electrodes, reflector electrodes, or the like are formed. These electrodes are made of, for example, an Al (99 wt %)-Cu (1 wt %) alloy or a laminate film of the Al (99 wt %)-Cu (1 wt %) alloy and Ti in order to improve the power durability performance. By using such a metal material and applying photolithography by a sputtering system, a reduced projection exposure apparatus (stepper), and a RIE (reactive ion etching) system, various types of electrodes are formed.

Next, a protective film is formed on predetermined regions of the electrodes. The protective film is formed by forming an SiO$_2$ film on the electrodes and piezoelectric substrate by a CVD (chemical vapor deposition) system, then patterning it by photolithography and etching parts for forming flip chip use windows by an RIE system or the like. After that, in that flip chip use windows, pad electrodes having a laminated structure of a Cr layer, Ni layer, and Au layer are formed by using a sputtering system. After that, a printing method and re-flow furnace are used to form solder bumps on the pad electrodes for flip chip mounting of the SAW devices on an external circuit board or the like.

Next, the mother board is diced along a division line and is divided into the individual SAW devices. After that, each chip is placed in an external package and bonded by a flip chip mount system so that the surface formed with the pad electrodes becomes the bottom surface. Finally, each package is baked in an N$_2$ gas atmosphere, whereby a packaged SAW device is completed.

First Modification Example

FIG. 3 is a plan view showing a first modification example of the SAW device shown in FIG. 1.

The SAW device shown in FIG. 3 has six SAW elements 12 to 17 each of which has three serially divided IDT electrodes 1 to 3 provided with a plurality of electrode fingers which are long in a direction perpendicular to the propagation direction of the SAW propagating on the piezoelectric substrate 100 and arranged along the propagation direction and has reflector electrodes 8 and 9 arranged at the two sides of three IDT electrodes 1 to 3 and provided with a plurality of electrode fingers which are long in the direction perpendicular to the propagation direction. The six SAW elements 12 to 17 are connected in parallel. Each of the six SAW elements 12 to 17 has comb-shaped electrode structure that IDT electrodes 1 to 3 mesh at the two sides of the center bus bar 20o.

Each IDT electrode according to this modification example has the same electrode finger structure as that of the SAW device shown in FIG. 1. Thus the applied power is dispersed in the SAW elements 12 to 17 and IDT electrodes 1 to 3 thereof, therefore concentration of energy to specific IDT electrodes 1 to 3 does not occur. Further, in the narrow pitch sections of the electrode fingers in portions where the IDT electrodes adjoin each other, the smallest value of the electrode finger pitches are same, therefore the power is equally dispersed and applied in the electrode finger narrow pitch sections, so concentration of energy to specific electrode finger narrow pitch sections does not occur. Thus a SAW device having sufficient power durability performance and electrical characteristics even at a high frequency can be realized.

Second Modification Example

Figure 4:
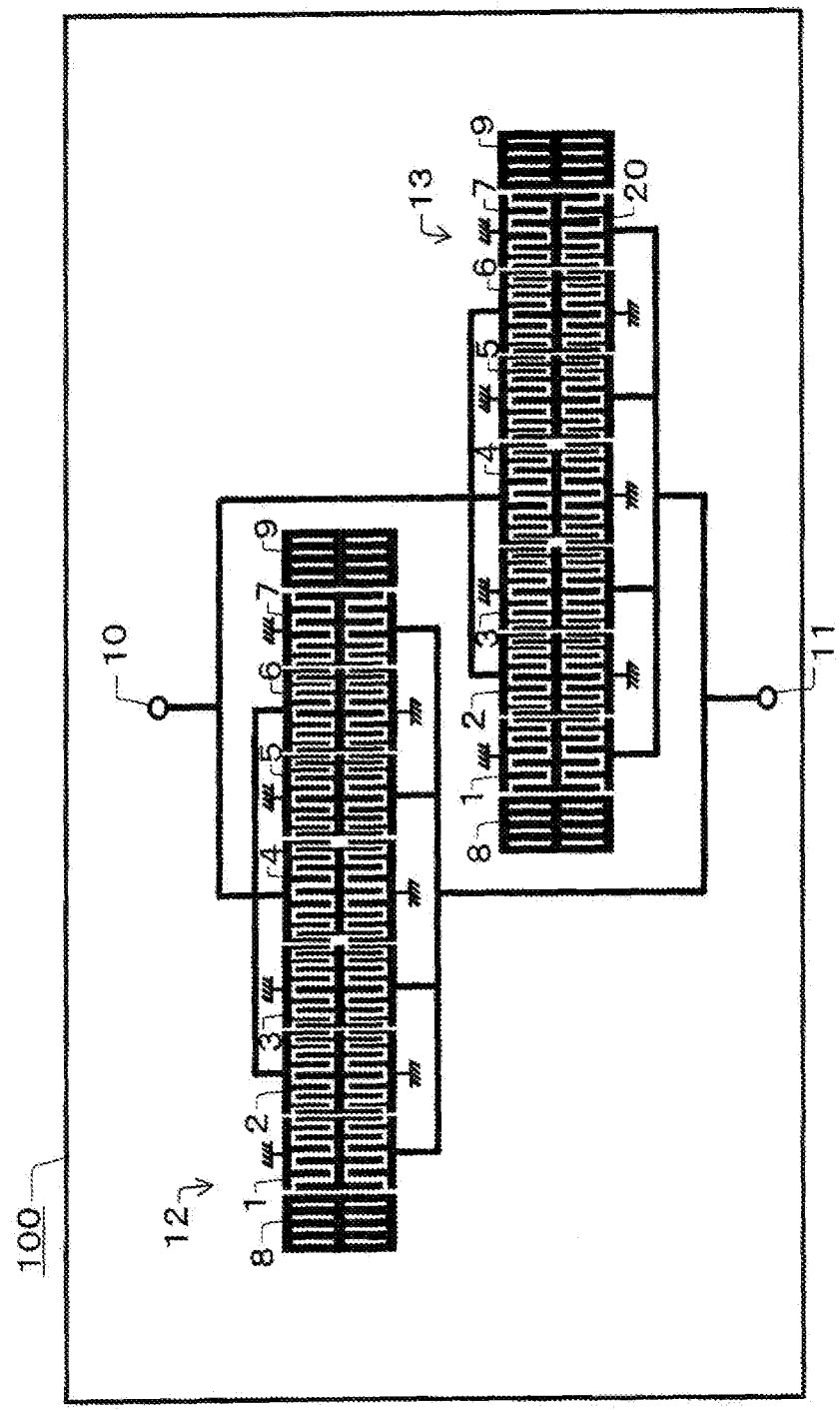
FIG. 4 A plan view showing a second modification example of the SAW device shown in FIG. 1.

FIG. 4 is a plan view showing a second modification example of the SAW device shown in FIG. 1.

The SAW device shown in FIG. 4 has two SAW elements 12 and 13 each of which has seven serially divided IDT electrodes 1 to 7 provided with a plurality of electrode fingers which are long in the direction perpendicular to the propagation direction of the SAW propagating on the piezoelectric substrate 100 and arranged along the propagation direction and has reflector electrodes 8 and 9 arranged at the two sides of seven IDT electrodes 1 to 7 and provided with a plurality of electrode fingers which are long in the direction perpendicular to the propagation direction. The two SAW elements 12 and 13 are connected in parallel. Each of the two SAW elements 12 and 13 has comb-shaped electrode structure that IDT electrodes 1 to 7 mesh at the two sides of the center bus bar 20o.

Each IDT electrode according to this modification example has the same electrode finger structure as the SAW device shown in FIG. 1. Thus the applied power is dispersed in the SAW elements 12 and 13 and their IDT electrodes 1 to 7, therefore concentration of energy to specific IDT electrodes 1 to 3 does not occur. Further, in the narrow pitch sections of electrode fingers in portions where the IDT electrodes are adjoin each other, the smallest value of the electrode finger pitches are same, therefore the power is equally dispersed and applied in the electrode finger narrow pitch sections, so concentration of energy to specific electrode finger narrow pitch sections does not occur. Thus a SAW device having sufficient power durability performance and electrical characteristics even at a high frequency can be realized. Further, two SAW elements are arranged while connected in parallel, therefore a small-sized SAW device can be realized.

Third Modification Example

Figure 5:
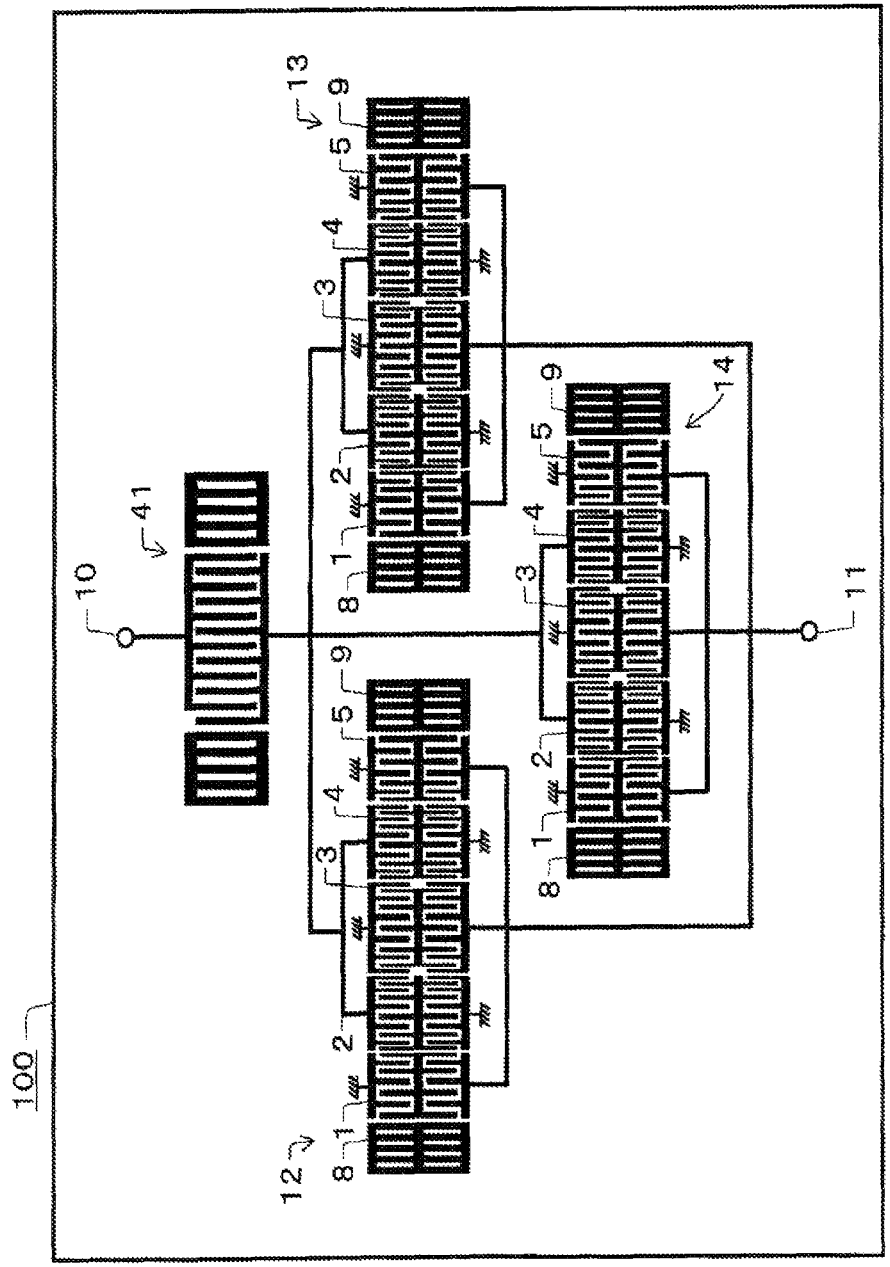
FIG. 5 A plan view showing a third modification example of the SAW device shown in FIG. 1.

FIG. 5 is a plan view showing a third modification example of the SAW device shown in FIG. 1. In the SAW device shown in FIG. 5, a surface acoustic wave resonator (SAW resonator) 41 is connected between the SAW elements 12 to 14 and the unbalanced input terminal 10. By connecting the SAW resonator 41 in this way, an attenuation pole can be formed, and by adjusting the period of the electrode fingers, characteristics can be controlled so as to satisfy demanded specifications. Further, by designing the device so that the electrode periods of a plurality of SAW resonators 41 are different, the attenuation pole can be controlled, and further a design satisfying sophisticated demanded specifications can be carried out.

Note that, the SAW resonator 41 may be inserted between the SAW elements 12 to 14 and the unbalanced output terminal 11 as well.

Fourth Modification Example

Figure 6:
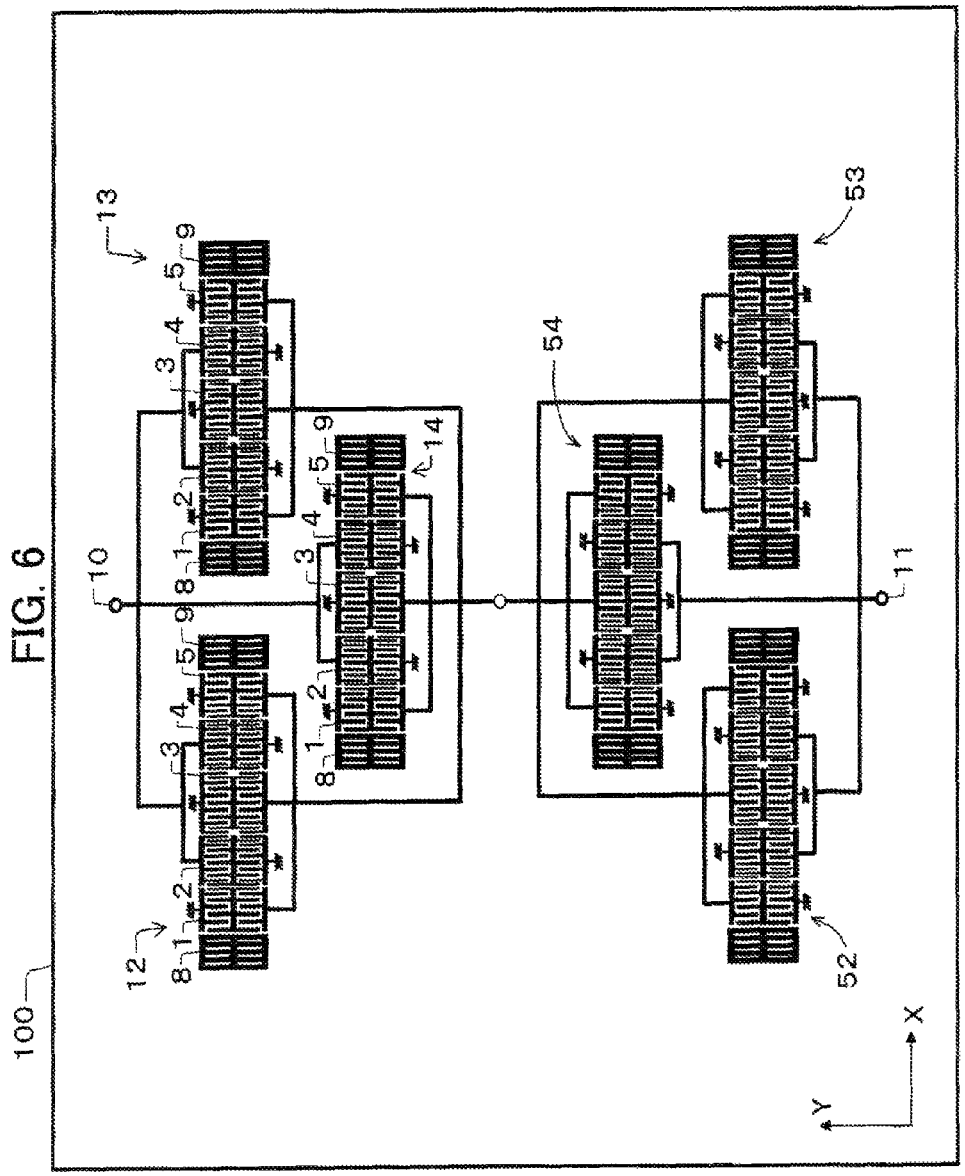
FIG. 6 A plan view showing a fourth modification example of the SAW device shown in FIG. 1.

FIG. 6 is a plan view showing a fourth modification example of the SAW device shown in FIG. 1. The SAW device shown in FIG. 6 is obtained by cascade-connecting a plurality of second SAW elements 52 to 54 with respect to the plurality of SAW elements 12 to 14 in the configuration of FIG. 1. By cascade-connecting the second SAW elements 52 to 54 in this way, a SAW device more excellent in attenuation characteristics than a SAW device configured by only SAW elements 12 to 14 is obtained. Note that, from the viewpoint of improving the attenuation characteristics, a configuration providing only one second SAW element with respect to the plurality of SAW elements 12 to 14 is also possible. However, when considering the power durability of the second SAW element as well, preferably the same number of second SAW elements as that of the SAW elements 12 to 14 are connected in parallel in the same way.

Fifth Modification Example

Figure 15:
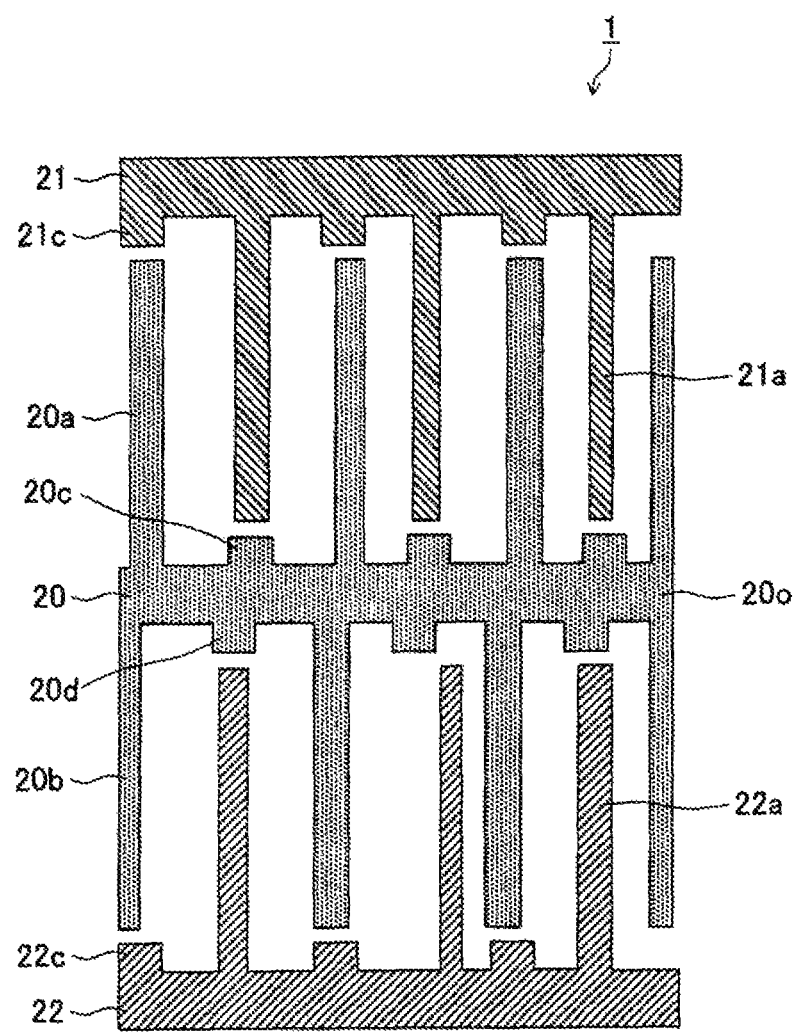
FIG. 15 A plan view showing a portion of the serially divided IDT electrodes in a fifth modification example of the SAW device shown in FIG. 1.

FIG. 15 is a plan view (view corresponding to FIG. 11) showing a serially divided IDT electrode 1 in a fifth modification example of the SAW device shown in FIG. 1. A floating electrode 20 of FIG. 15 is configured with first dummy electrode fingers 20c and second dummy electrode fingers 20d provided in addition to the configuration of the floating electrode 20 of FIG. 11.

The first dummy electrode fingers 20c project from the center bus bar 20o to the first region (first electrode 21 side) between the electrode fingers 20a. The tip ends thereof are located closer to the center bus bar 20o side than the tip ends of the electrode fingers 21a of the first electrode 21. In the same way, the second dummy electrode fingers 20d project from the center bus bar 20o to the second region (second electrode 22 side) between the electrode fingers 20b. The tip ends thereof are located closer to the center bus bar 20o side than the tip ends of the electrode fingers 22a of the second electrode 22.

Further, the first electrode 21 of FIG. 15 is configured provided with dummy electrode fingers 21c in addition to the configuration of the first electrode 21 of FIG. 11. The dummy electrode fingers 21c project from the bus bar of the first electrode 21 to the floating electrode 20 side between the electrode fingers 21a. The tip ends thereof are located closer to the bus bar side of the first electrode 21 than the tip ends of the electrode fingers 20a of the floating electrode 20.

In the same way, the second electrode 22 of FIG. 15 is configured provided with dummy electrode fingers 22c in addition to the configuration of the second electrode 22 of FIG. 11. The dummy electrode fingers 22c extend from the bus bar of the second electrode 22 to the floating electrode 20 side between the electrode fingers 22a. The tip ends thereof are located closer to the bus bar side of the second electrode 22 than the tip ends of the electrode fingers 20b of the floating electrode 20.

By provision of the first dummy electrode fingers 20c, leakage of the SAW from the first region to the second region over the center bus bar 20o is suppressed. As a result, noise regarding electrical connection of the first region and the second region through the floating electrode 20 is reduced, and acquisition of the desired characteristics is facilitated.

In the same way, by provision of the second dummy electrode fingers 20d, leakage of the SAW from the second region to the first region over the center bus bar 20o is suppressed. By suppression of leakage of the SAW in both of the first region and the second region by the first dummy electrode fingers 20c and second dummy electrode fingers 20d, noise regarding electrical connection of the first region and the second region through the floating electrode 20 is reduced more reliably.

Further, by provision of the dummy electrode fingers 21c and the dummy electrode fingers 22 c, leakage of the SAW from the IDT electrode 1 is suppressed, and insertion loss is suppressed.

Note that, the positions of the dummy electrode fingers 20c (or 20d, 21c, and 22c) between the electrode fingers 20a (or 20b, 21a, and 22a), their widths, projection amounts, and shapes may be suitably set in accordance with various circumstances such as the frequency of the pass band or the like. The positions, widths, projection amounts, and shapes of the plurality of dummy electrode fingers may be the same as each other or different from each other. Note, if the tip ends of the dummy electrode fingers 20c (or 20d, 21c, and 22c) project out more than the tip ends of the electrode fingers 21a (or 22a, 20a, and 20b) extended from the opposite side, acquisition of the desired characteristics is obstructed. Therefore, preferably the tip ends of the dummy electrode fingers face the tip ends of the electrode fingers extended from the opposite side with a predetermined gap, and that gap G is set within a range of for example $0<G\le0.25\lambda$ ($\lambda$ is the wavelength of SAW).

Note that, the above modification examples may be combined with each other within a range not out of the gist of the present invention.

Communication Apparatus

Figure 7:
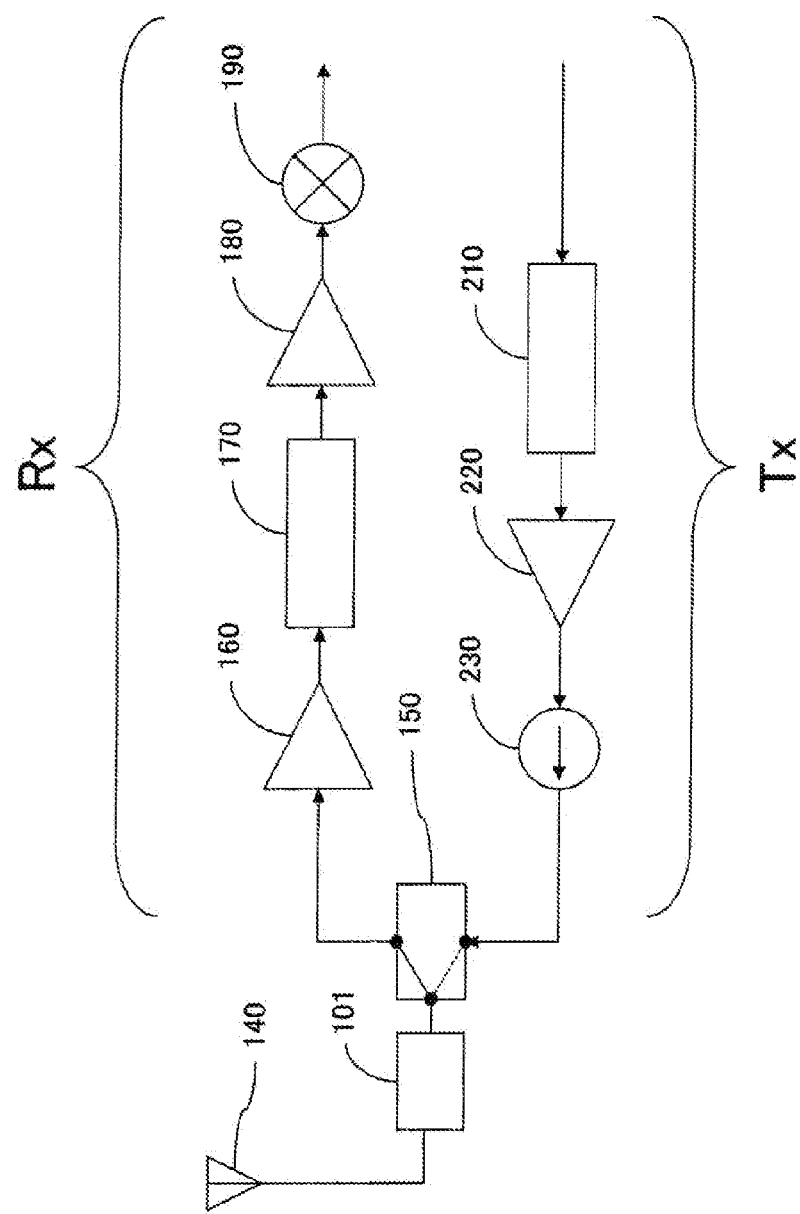
FIG. 7 A block circuit diagram showing an embodiment of a communication apparatus according to the present invention.

FIG. 7 is a block diagram showing an embodiment of a communication apparatus according to the present invention. In FIG. 7, an antenna 140 is connected to a transmitting circuit Tx and a receiving circuit Rx through a filter 101 and a switch 150. A transmitted high frequency signal is stripped of unrequired signal components by a filter 210, amplified by a power amplifier 220, and then passed through an isolator 130 and the switch 150 and the emitted from the antenna 140. Further, a high frequency signal received at the antenna 140 is passed through the switch 150, amplified at a low noise amplifier 160, stripped of unrequired signal components by a filter 170, then re-amplified at an amplifier 180 and converted to a low frequency signal by a mixer 190. When for example the filter 101 is configured by using the SAW device in the embodiment explained above, the filter 101 becomes excellent in power durability performance, and a communication apparatus having characteristics stable over a long time and having a high reliability is obtained.

EXAMPLES

Working Example 1

Next, an explanation is given of Working Example 1 (SAW filter) of the SAW device according to the present invention.

FIG. 8A schematically shows a plan view of a SAW element 20 configuring SAW filters of Working Example 1 and Comparative Example 1. As shown in the same figure, the SAW element 20 is configured provided with seven serially divided IDT electrodes 1 to 7 arranged on a line along the propagation direction of the SAW and with reflectors 8 and 9 arranged at the two sides of the former. By connecting two such SAW elements 20 in parallel to each other, SAW filters of Working Example 1 and Comparative Example 1 configured as shown in FIG. 4 were produced. For the piezoelectric substrate 100, use was made of a 38.7 Y-cut X-propagation LiTaO$_3$. Various types of electrodes were formed by Al—Cu, and the film thickness thereof was set to 1450 Å. Between the SAW filter of Working Example 1 and the SAW filter of Comparative Example 1, the method of change of the electrode finger pitch of the SAW elements 20 differs.

Figure 8B:
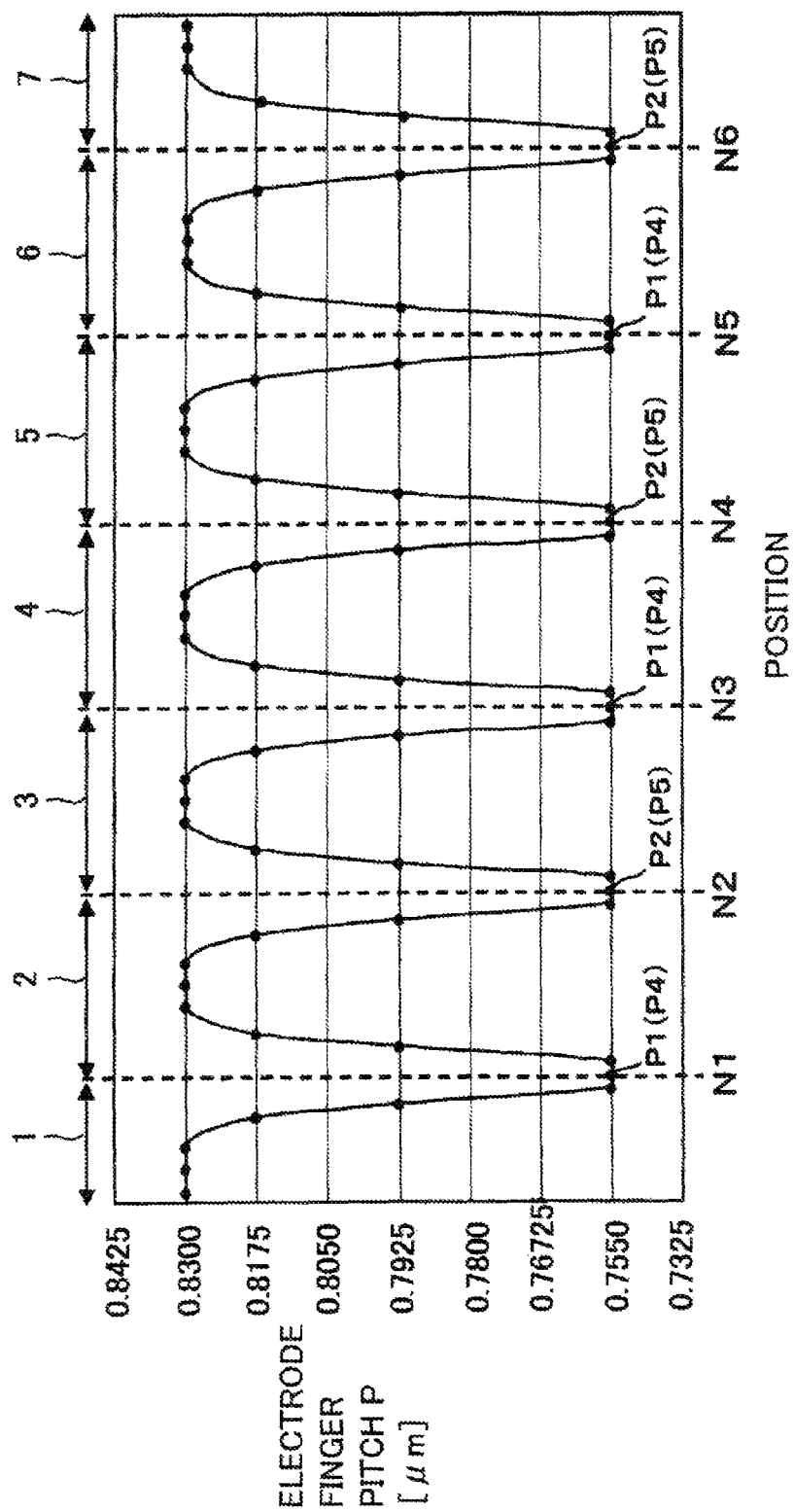
FIG. 8B A graph showing electrode finger pitches of serially divided IDT electrodes of Working Example 1.

FIG. 8B is a diagram plotting electrode finger pitches of the SAW element 20 configuring the SAW filter of Working Example 1, shows a situation of change of electrode finger pitch in the first region by solid lines, and shows a situation of change of electrode finger pitch in the second region by broken lines. Note that, in the SAW element 20 of Working Example 1, the electrode fingers are arranged so that all of the electrode finger pitches in the first region and electrode finger pitches in the second region become equal, therefore the broken lines showing the situation of change of the electrode finger pitch in the second region overlap the solid lines. As shown in the same figure, in the SAW element 20 of Working Example 1, the electrode fingers are arranged so that the electrode finger pitch between adjacent IDT electrodes (N1 to N6) is the smallest, and the electrode finger pitch in the first region and the electrode finger pitch in the second region in the same boundary section become equal.

Figure 8C:
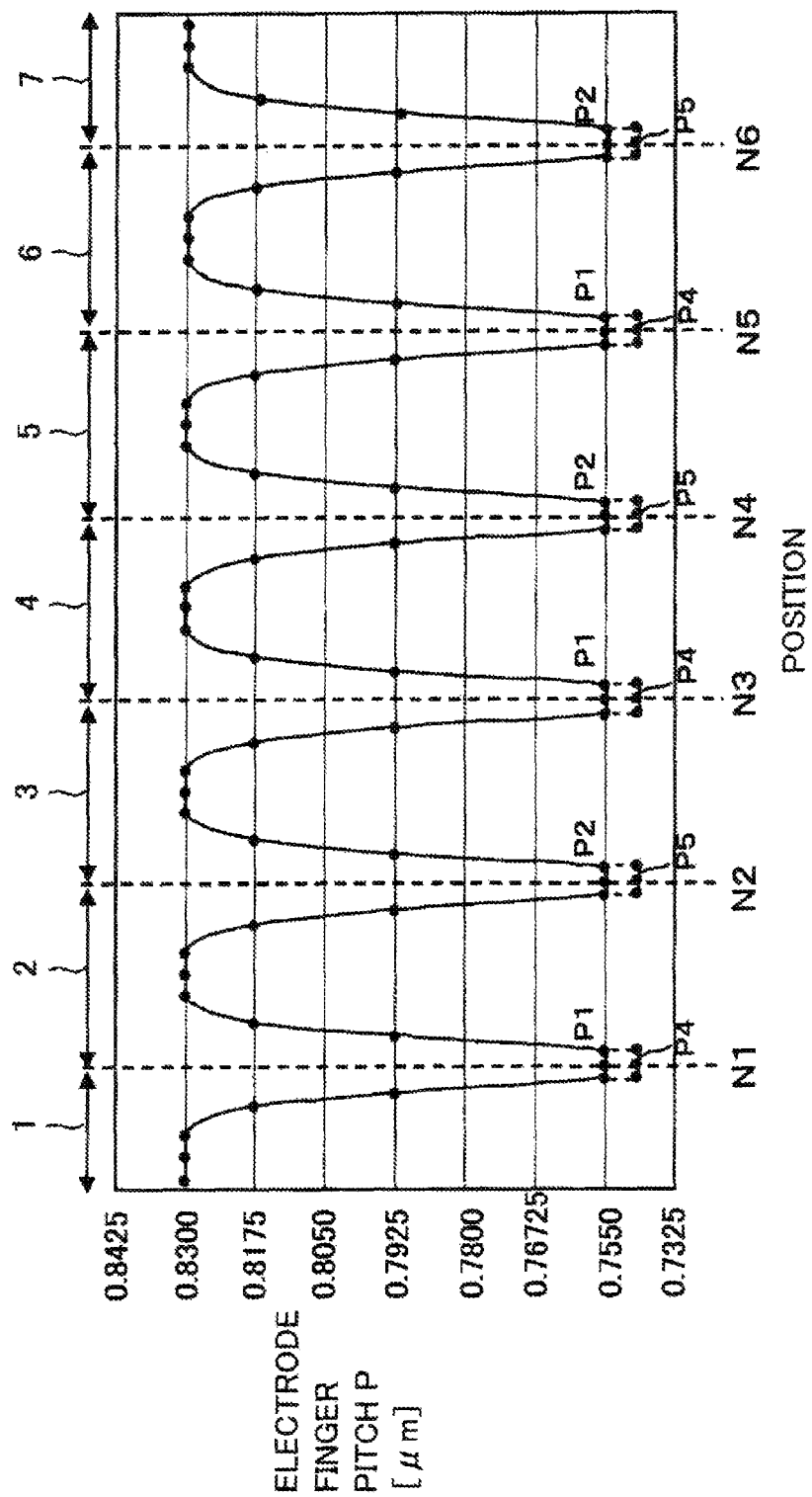
FIG. 8C A graph showing electrode finger pitches of serially divided IDT electrodes of Comparative Example 1
Figure 10:
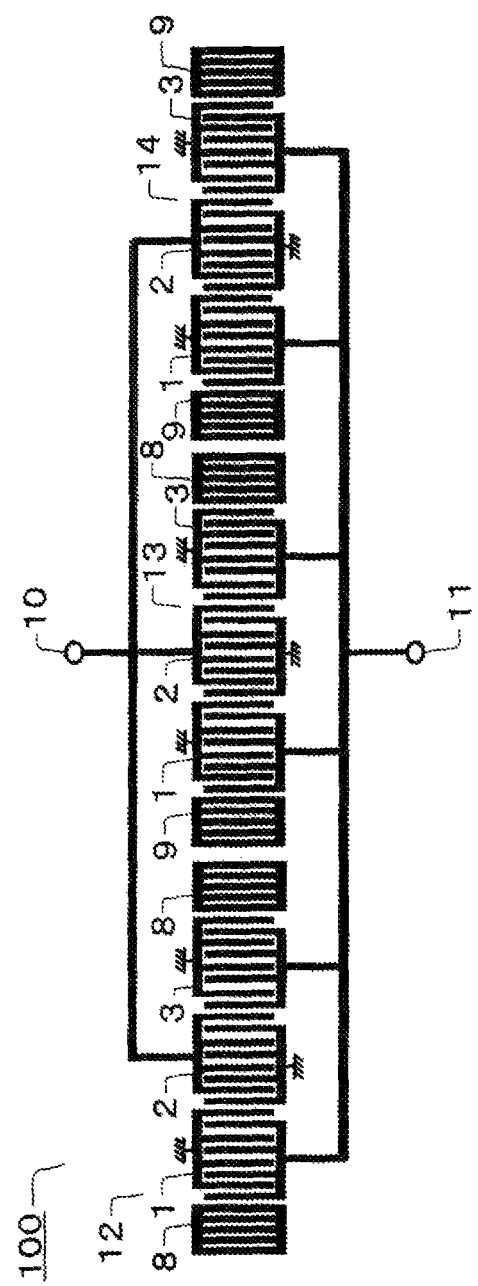
FIG. 10 A plan view showing a conventional SAW device.

FIG. 8C is a diagram plotting electrode finger pitches of the SAW element 20 configuring the SAW filter of Comparative Example 1, shows a situation of change of electrode finger pitch in the first region by solid lines, and shows a situation of change of electrode finger pitch in the second region by broken lines. As shown in FIG. 8C, in the SAW element of Comparative Example 1, the electrode finger pitches (P1 and P2) at the boundary of the IDT electrodes in the first region or electrode finger pitches (P4 and P5) at the boundary of the IDT electrodes in the second region become equal with each other, but the electrode finger pitch in the first region and the electrode finger pitch in the second region located on the same boundary (P1 and P4, or P2 and P5) are different. Specifically, P1 has become larger than P4, and P2 has become larger than P5.

A power durability test was run for the two filters of Working Example 1 and Comparative Example 1. The conditions of the power durability test are a continuous wave, applied power of 27 dBm, applied frequency of 2450 MHz, and ambient temperature of 85° C. The times until the electrode fingers of the IDT electrodes broke down under these conditions were compared. Note that, breakdown of the electrode finger was judged by monitoring the change of amount of passage through the filter and according to whether a loss of 0.3 dB occurred.

The SAW filter of Working Example 1 took 25 hours until breakdown. In contrast, the time taken by the SAW filter of Comparative Example 1 until breakdown was 3.5 hours. From this result, it was confirmed that the power durability performance of the SAW filter was more improved in the case of making the electrode finger pitch in the first region and the electrode finger pitch in the second region located on the same boundary equal compared with the case where the two were not equal.

Working Example 2

Next, an explanation is given of Working Example 2 (SAW filter) of the SAW device according to the present invention.

By connecting two SAW elements 20 configured as shown in FIG. 8A in parallel to each other in the same way as Working Example 1, SAW filters of Working Example 2 and Comparative Example 2 configured as shown in FIG. 4 were produced. Between the SAW filter of Working Example 2 and the SAW filter of Comparative Example 2, the method of change of the electrode finger pitch of the SAW element 20 differs.

Figure 12A:
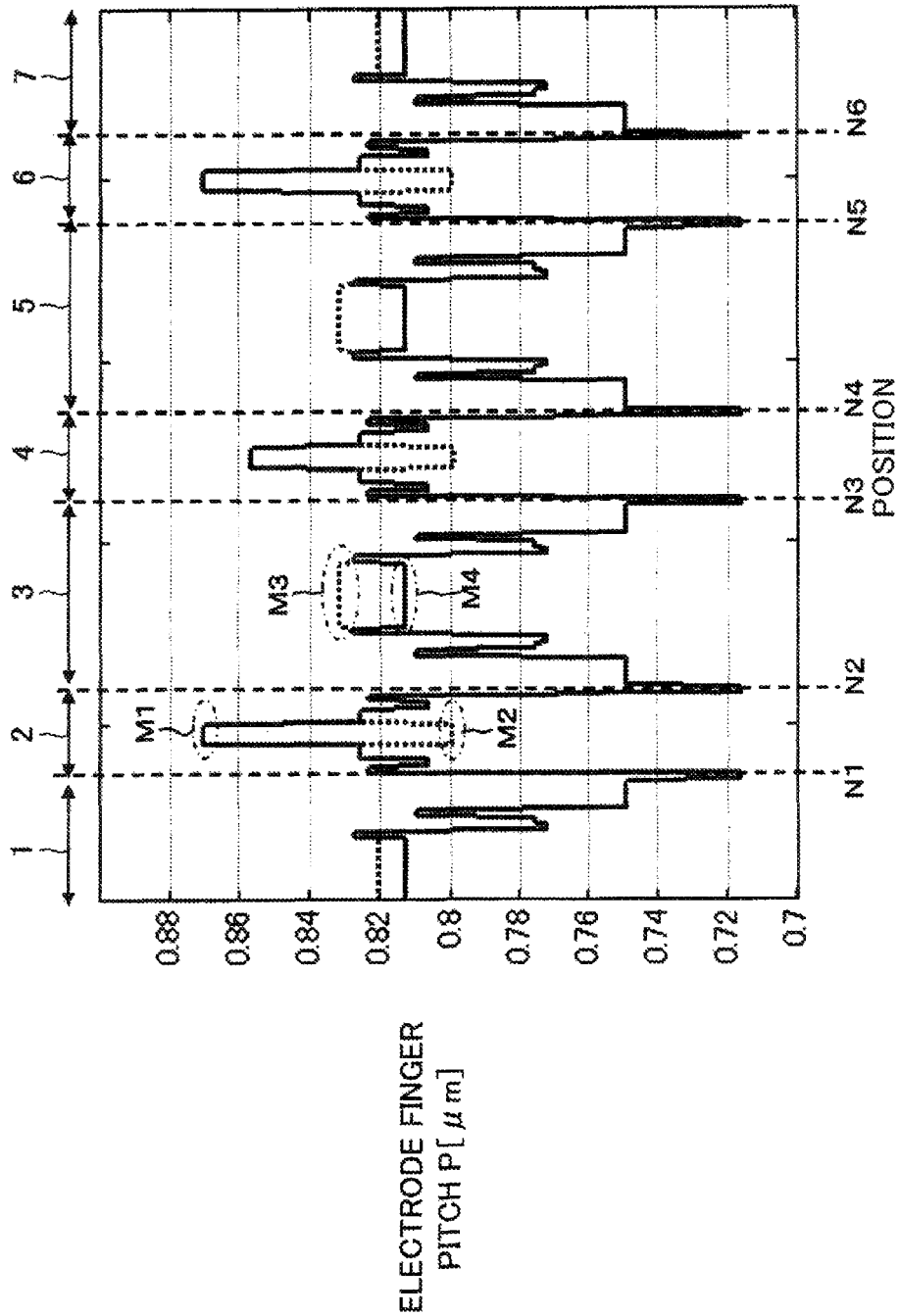
FIG. 12A A graph showing electrode finger pitches of IDT electrodes of Working Example 2.

FIG. 12A is a diagram showing the situation of change of the electrode finger pitch of the SAW element 20 configuring the SAW filter of Working Example 2, shows the situation of change of the electrode finger pitch in the first region by solid lines, and shows the situation of change of the electrode finger pitch in the second region by broken lines. As shown in the same figure, in the SAW element 20 of Working Example 2, the electrode fingers are arranged so that the electrode finger pitch between adjacent IDT electrodes (N1 to N6) is the smallest, and the electrode finger pitch in the first region and the electrode finger pitch in the second region in the same boundary section become equal. Further, in the SAW element 20 of Working Example 2, the electrode fingers are arranged so that a first major pitch section and a second major pitch section are provided in one of adjacent IDT electrodes, a third major pitch section and a fourth major pitch section are provided in the other, and these major pitch sections satisfy predetermined relationships. For example, in the IDT electrode 2, a first major pitch section M1 is provided in the first region, and a second major pitch section M2 comprised of a pitch smaller than the pitch of the first major pitch section M1 is provided in the second region. Further, in the IDT electrode 3 adjacent to the IDT electrode 2, a third major pitch section M3 is provided in the first region, and a fourth major pitch section M4 comprised of a pitch larger than the pitch of the third major pitch section is provided in the second region.

FIG. 12B is a diagram showing the situation of change of the electrode finger pitch of the SAW element 20 configuring the SAW filter of Comparative Example 2, shows the situation of change of the electrode finger pitch in the first region by solid lines, and shows the situation of change of the electrode finger pitch in the second region by broken lines. In Comparative Example 2, all of the electrode finger pitches in the first region and electrode finger pitches in the second region are equal.

For the SAW filters of Working Example 2 and Comparative Example 2, the frequency characteristics of the attenuation amounts and frequency characteristics of the VSWR were measured.

Figure 13A:
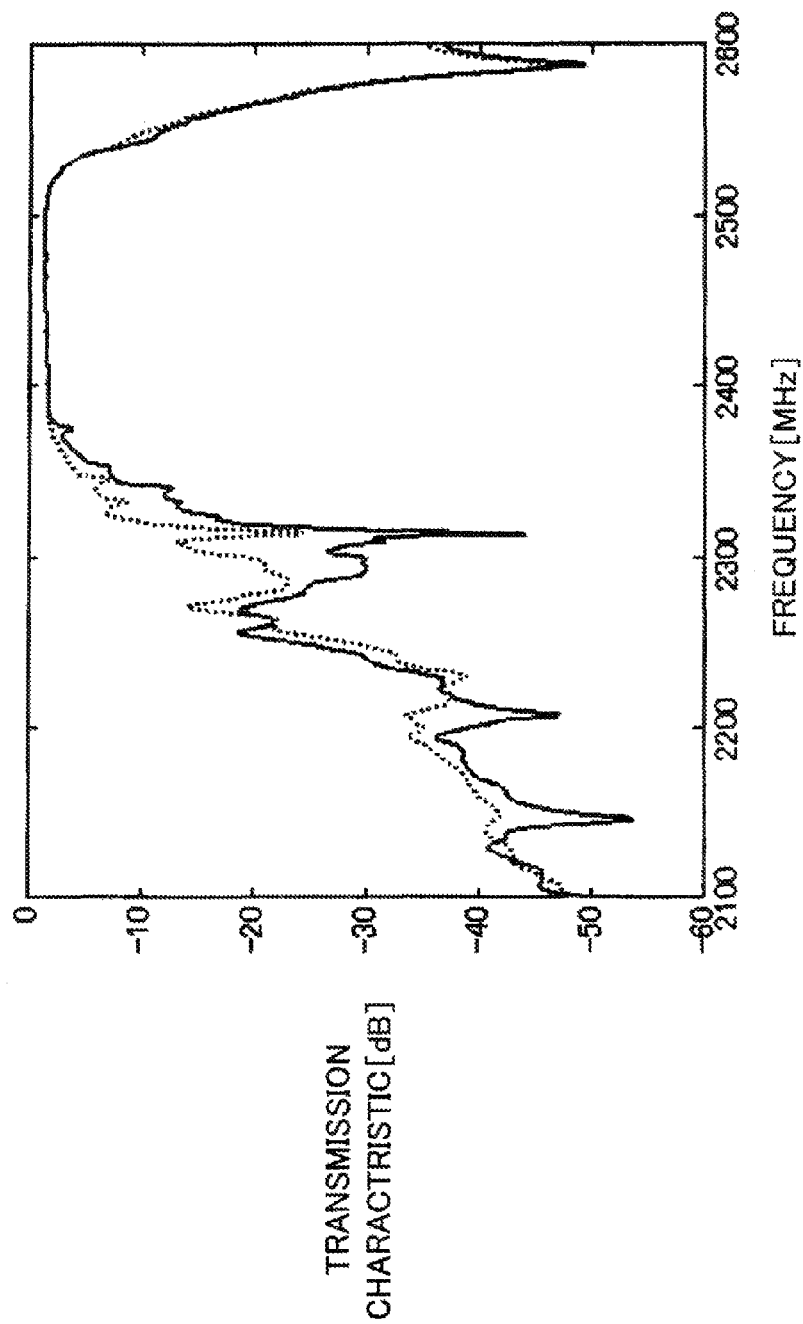
FIG. 13A A graph showing frequency characteristics of attenuation amounts in Working Example 2 and Comparative Example 2.
Figure 13B:
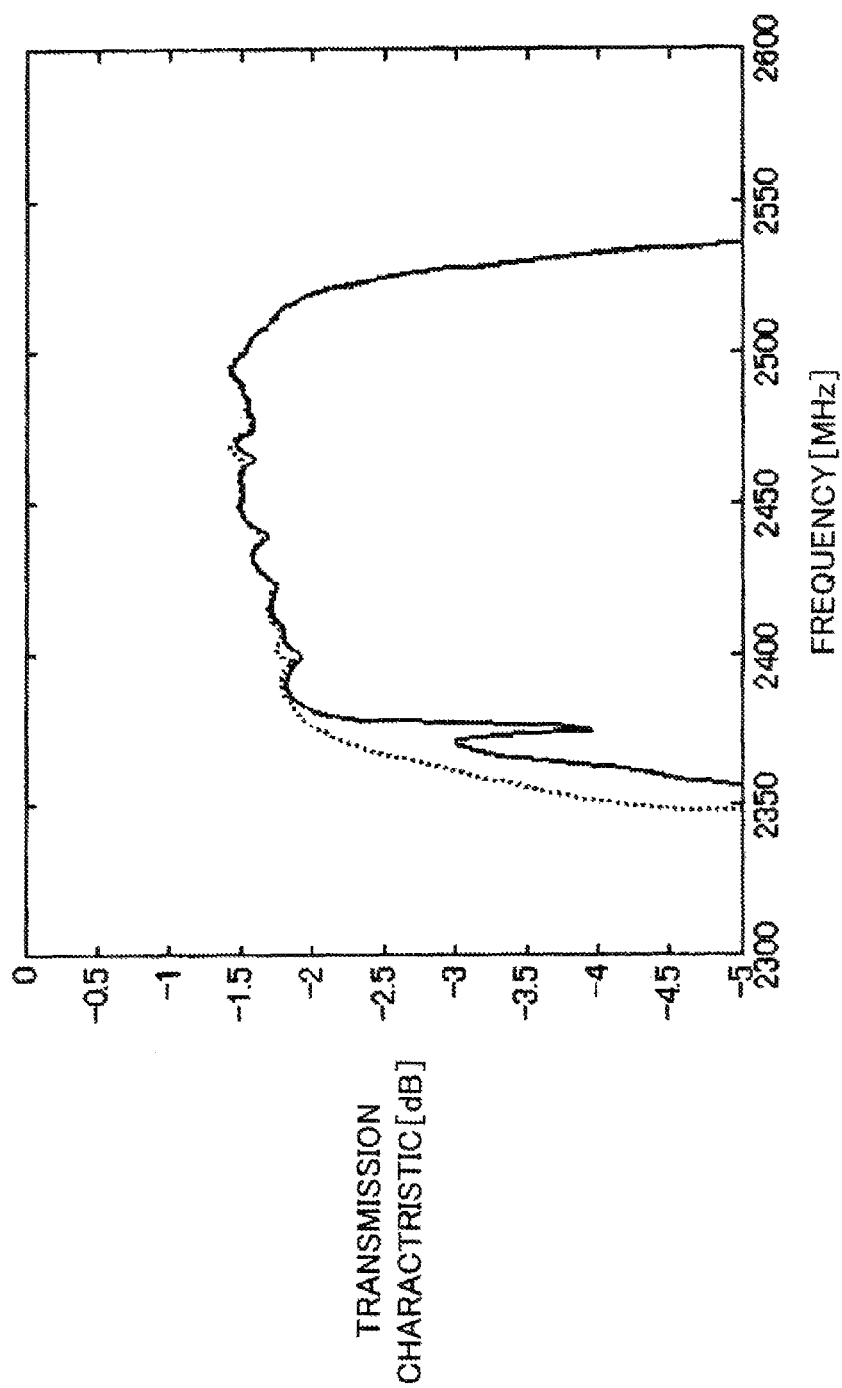
FIG. 13B A graph enlarging a principal part of the frequency characteristics of attenuation amounts shown in FIG. 13A.

FIG. 13A is a diagram showing measurement results of the frequency characteristics of attenuation amounts. An enlarged diagram of a principal part thereof is shown in FIG. 13B. The attenuation amount frequency characteristic of the SAW filter of Working Example 2 is indicated by a solid line, and the attenuation amount frequency characteristic of Comparative Example 2 is indicated by a broken line. As clearly seen from FIG. 13, in comparison with the SAW filter of Comparative Example 2, the SAW filter of Working Example 2 is raised in the steepness at the low side position very near the pass band. By raising the steepness at the low side position very near the pass band in this way, for example, in a system in which the transmission side frequency band and the reception side frequency band are close, by using the SAW filter of Working Example 2 as the high frequency side filter, interference of the signal on the transmission side and the signal on the reception side can be suppressed.

Figure 14:
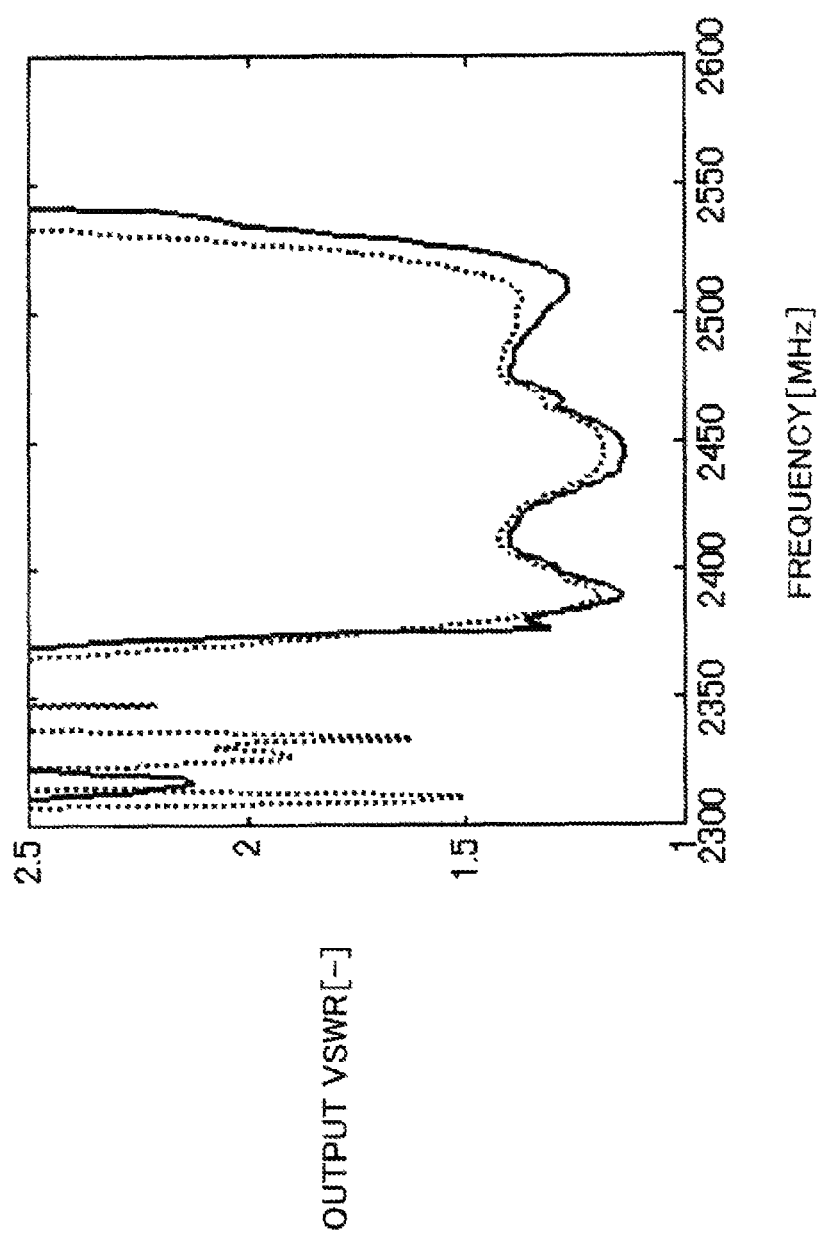
FIG. 14 A graph showing frequency characteristics of a VSWR in Working Example 2 and Comparative Example 2.

FIG. 14 is a diagram showing measurement results of the frequency characteristic of the VSWR. The frequency characteristic of the VSWR of the SAW filter of Working Example 2 is indicated by a solid line, and the frequency characteristic of the VSWR of Comparative Example 2 is indicated by a broken line. As clearly seen from FIG. 14, in comparison with the SAW filter of Comparative Example 2, the SAW filter of Working Example 2 is enhanced in VSWR in the pass band (2400 MHz to 2500 MHz).

In general, when making the attenuation in the vicinity of the pass band steep, the VSWR tends to deteriorate. However, from the results described above, in the SAW filter of Working Example 2, it could be confirmed that the attenuation in the vicinity of the pass band could be made steep while keeping the VSWR low.

CITATION LIST

100 . . . piezoelectric substrate
1 to 5 . . . IDT electrodes
8, 9 . . . reflector electrodes
10, 11 . . . unbalanced signal terminals
12 to 17 . . . surface acoustic wave elements
20 . . . floating electrode
21 . . . first electrode
22 . . . second electrode
52 to 54 . . . second surface acoustic wave elements

The invention claimed is:

1. A surface acoustic wave device, comprising:
a piezoelectric substrate; and
a plurality of surface acoustic wave elements on the piezoelectric substrate, wherein
each surface acoustic wave element comprises N number of IDT electrodes having a serially divided structure and arranged along a propagation direction of a surface acoustic wave, N being a whole number of 3 or more,
each of the IDT electrodes comprises
floating electrode comprising
a center bus bar,
a plurality of first forting electrode fingers having first end connected to one long side of the center bus bar and arranged at intervals from each other, and
a plurality of second floating electrode fingers having first ends connected to the other long side of the center bus bar and arranged at intervals from each other,
a first electrode with a plurality of electrode fingers between the plurality of first floating electrode fingers, and
a second electrode with a plurality of electrode fingers between the plurality of second floating electrode fingers,
when any three continuously and sequentially arranged IDT electrodes among the plurality of IDT electrodes are a first, second, and third IDT electrodes in the order of arrangement, and
when dividing each surface acoustic wave element into a first region and a second region using a center line of the center bus bar as the boundary, and the first region comprises the first floating electrode fingers and first electrode and the second region comprises the second floating electrode fingers and second electrode are arranged,
a first electrode finger pitch P1 at the boundary between the first IDT electrode and the second IDT electrode in the first region and a second electrode finger pitch P2 at the boundary between the second IDT electrode and the third IDT electrode in the first region are equal, the first and second electrode finger pitches P1 and P2 are the smallest among all electrode finger pitches of the N number of IDT electrodes in the first region, and
each of the IDT electrodes comprises a third electrode finger pitch P3 larger than the first and second electrode finger pitches P1 and P2 in the first region,
wherein in the IDT electrodes, electrode finger pitch from one end to the other end in the first region and electrode finger pitch from one end to the other end in the second region changes differently.

2. The surface acoustic wave device according to claim 1, wherein:
a fourth electrode finger pitch P4 at a boundary between the first IDT electrode and the second IDT electrode in the second region and the first electrode finger pitch P1 are equal, a fifth electrode finger pitch P5 at a boundary between the second IDT electrode and the third IDT electrode in the second region and the second electrode finger pitch P2 are equal, the fourth and fifth, electrode finger pitches P4 and P5 are the smallest among all electrode finger pitches of the N number of IDT electrodes in the second region, and each of the IDT electrodes comprises a sixth electrode finger pitch P6 larger than the fourth and fifth electrode finger pitches P4 and P5 in the second region.

3. The surface acoustic wave device according to claim 1, wherein the floating electrode further comprises first dummy electrode fingers projecting from the center bus bar to the first region, and the tip ends of the first dummy electrode fingers are closer to the center bus bar side than the tip ends of the electrode fingers of the first electrode.

4. The surface acoustic wave device according to claim 3, wherein the floating electrode further comprises second dummy electrode fingers projecting from the center bus bar to the second region, and the tip ends of the second dummy electrode fingers are closer to the center bus bar side than the tip ends of the electrode fingers of the second electrode.

5. The surface acoustic wave device according to claim 1, wherein the plurality of surface acoustic wave elements are connected in parallel to each other.

6. The surface acoustic wave device according to claim 1, wherein the electrode fingers are arranged so that electrode finger pitches adjacent to the two sides of the first electrode finger pitch P1 become equal to the first electrode finger pitch P1, and electrode finger pitches adjacent to the two sides of the second electrode finger pitch P2 become equal to the second electrode finger pitch P2.

7. The surface acoustic wave device according to claim 1, wherein the surface acoustic wave device configured to operate as a frequency filter of which a pass frequency band is 2300 MHz to 2700 MHz.

8. The surface acoustic wave device according to claim 1, further comprising:

a surface acoustic wave resonator comprising an IDT electrode comprising a plurality of electrode fingers which are long in a direction perpendicular to the propagation direction of a surface acoustic wave propagating on the piezoelectric substrate and arranged along the propagation direction, and reflector electrodes at the two sides of the IDT electrode; and an unbalanced input or output terminal, wherein the surface acoustic wave resonator is connected between the surface acoustic wave elements and the unbalanced input or output terminal.

9. The surface acoustic wave device according to claim 1, further comprising:

reflector electrodes which comprises a plurality of electrode fingers which is long in a direction perpendicular to the propagation direction of the surface acoustic wave and are arranged at the two sides of the surface acoustic wave element.

10. The surface acoustic wave device according to claim 1, further comprising:

a second surface acoustic wave element cascade-connected with respect to the plurality of surface acoustic wave elements.

11. The surface acoustic wave device according to claim 1, wherein in two adjacent IDT electrodes among the N number of IDT electrodes, one IDT electrode comprises a first major pitch section in the first region, and a second major pitch section having a pitch smaller than that of the first major pitch section in the second region, and the other IDT electrode comprises a third major pitch section in the first region and comprises a fourth major pitch section having a pitch larger than that of the third major pitch section in the second region.

12. A communication apparatus, comprising:

the surface acoustic wave device according to claim 1; and at least one of a receiving circuit and a transmitting circuit.

* * * * *